United States Patent
Chen et al.

(10) Patent No.: US 12,174,545 B2
(45) Date of Patent: *Dec. 24, 2024

(54) SYSTEM AND METHOD FOR PERFORMING EXTREME ULTRAVIOLET PHOTOLITHOGRAPHY PROCESSES

(71) Applicant: Taiwan Semiconductor Manufacturing Co., Ltd., Hsinchu (TW)

(72) Inventors: Tai-Yu Chen, Hsinchu (TW); Sagar Deepak Khivsara, Hsinchu (TW); Kuo-An Liu, Hsinchu (TW); Chieh Hsieh, Hsinchu (TW); Shang-Chieh Chien, Hsinchu (TW); Gwan-Sin Chang, Hsinchu (TW); Kai Tak Lam, Hsinchu (TW); Li-Jui Chen, Hsinchu (TW); Heng-Hsin Liu, Hsinchu (TW); Chung-Wei Wu, Hsinchu (TW); Zhiqiang Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/361,254

(22) Filed: Jul. 28, 2023

(65) Prior Publication Data

US 2023/0367225 A1    Nov. 16, 2023

Related U.S. Application Data

(63) Continuation of application No. 17/867,318, filed on Jul. 18, 2022, now Pat. No. 11,768,437, which is a
(Continued)

(51) Int. Cl.
*G03F 7/00*    (2006.01)

(52) U.S. Cl.
CPC ...... *G03F 7/70033* (2013.01); *G03F 7/70166* (2013.01); *G03F 7/705* (2013.01); *G03F 7/70916* (2013.01); *G03F 7/70933* (2013.01)

(58) Field of Classification Search
CPC .. G03F 7/70033; G03F 7/70166; G03F 7/705; G03F 7/70916; G03F 7/70933;
(Continued)

(56) References Cited

U.S. PATENT DOCUMENTS 11,392,040 B2 *   7/2022   Chen ............... H05G 2/003
11,768,437 B2 *   9/2023   Chen ............... G03F 7/70166
                                                            355/67
(Continued)

FOREIGN PATENT DOCUMENTS

TW           200510954 A       3/2005
WO     WO-2018203369 A1 *    11/2018    ............... G03F 7/20

OTHER PUBLICATIONS

English translation of WO2018/203369 (Year: 2018).*

*Primary Examiner* — Christina A Riddle
(74) *Attorney, Agent, or Firm* — Seed IP Law Group

(57) ABSTRACT

A photolithography system utilizes tin droplets to generate extreme ultraviolet radiation for photolithography. The photolithography system irradiates the droplets with a laser. The droplets become a plasma and emit extreme ultraviolet radiation. The photolithography system senses contamination of a collector mirror by the tin droplets and adjusts the flow of a buffer fluid to reduce the contamination.

20 Claims, 16 Drawing Sheets

Related U.S. Application Data continuation of application No. 17/193,827, filed on Mar. 5, 2021, now Pat. No. 11,392,040.

(60) Provisional application No. 63/021,478, filed on May 7, 2020.

(58) Field of Classification Search
CPC ............... G03F 7/70175; G03F 7/2004; G03F 7/70491; G03F 7/70483–70541; G03F 7/7015; G03F 7/702; G03F 7/70233; G03F 7/708; G03F 7/70808; G03F 7/70841; G03F 7/7085; G03F 7/70858; G03F 7/70883; G03F 7/70908–70941; G03F 7/70983; G03F 7/70975; H05G 2/005; H05G 2/00–008
USPC ............. 355/18, 30, 52–55, 67–71, 77, 133; 250/492.1–492.3, 493.1, 494.1, 503.1, 250/504 R, 505.1

See application file for complete search history.

(56) References Cited

U.S. PATENT DOCUMENTS

| | | |
|---|---|---|
| 2007/0249071 A1 | 10/2007 | Lian et al. |
| 2010/0051827 A1 | 3/2010 | Derra et al. |
| 2010/0183987 A1* | 7/2010 | Yonekawa .......... G03F 7/70866 355/30 |
| 2010/0288302 A1* | 11/2010 | Ehm ........................ B08B 5/02 134/1.1 |
| 2011/0048452 A1 | 3/2011 | Zink et al. |
| 2011/0204249 A1 | 8/2011 | Nagai et al. |
| 2015/0282287 A1 | 10/2015 | De Dea et al. |
| 2016/0007433 A1* | 1/2016 | McGeoch ............. H05G 2/008 250/504 R |
| 2016/0132042 A1 | 5/2016 | Wu |
| 2016/0170311 A1* | 6/2016 | Schmitt-Weaver .......... G03F 7/70516 355/67 |
| 2018/0173117 A1* | 6/2018 | Chien ................ G03F 7/70916 |
| 2018/0224748 A1* | 8/2018 | Nagai ...................... G21K 1/06 |
| 2020/0003414 A1 | 1/2020 | Tsai et al. |
| 2020/0033739 A1* | 1/2020 | Hori ....................... H05G 2/008 |
| 2020/0137863 A1 | 4/2020 | Hsu et al. |
| 2022/0404722 A1 | 12/2022 | Pan et al. |

* cited by examiner

SYSTEM AND METHOD FOR PERFORMING EXTREME ULTRAVIOLET PHOTOLITHOGRAPHY PROCESSES

BACKGROUND

Technical Field

The present disclosure relates to the field of photolithography. The present disclosure relates more particularly to extreme ultraviolet photolithography.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features on an integrated circuit die are produced, in part, with the aid of photolithography. Traditional photolithography techniques include generating a mask outlining the pattern of features to be formed on an integrated circuit die. The photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet light is used to produce particularly small features due to the relatively short wavelength of extreme ultraviolet light. For example, extreme ultraviolet light is typically produced by irradiating droplets of selected materials with a laser beam. The energy from the laser beam causes the droplets to enter a plasma state. In the plasma state, the droplets emit extreme ultraviolet light. The extreme ultraviolet light travels toward a collector with an elliptical or parabolic surface. The collector reflects the extreme ultraviolet light to a scanner. The scanner illuminates the target with the extreme ultraviolet light via a mask.

DETAILED DESCRIPTION

Figure 1A:
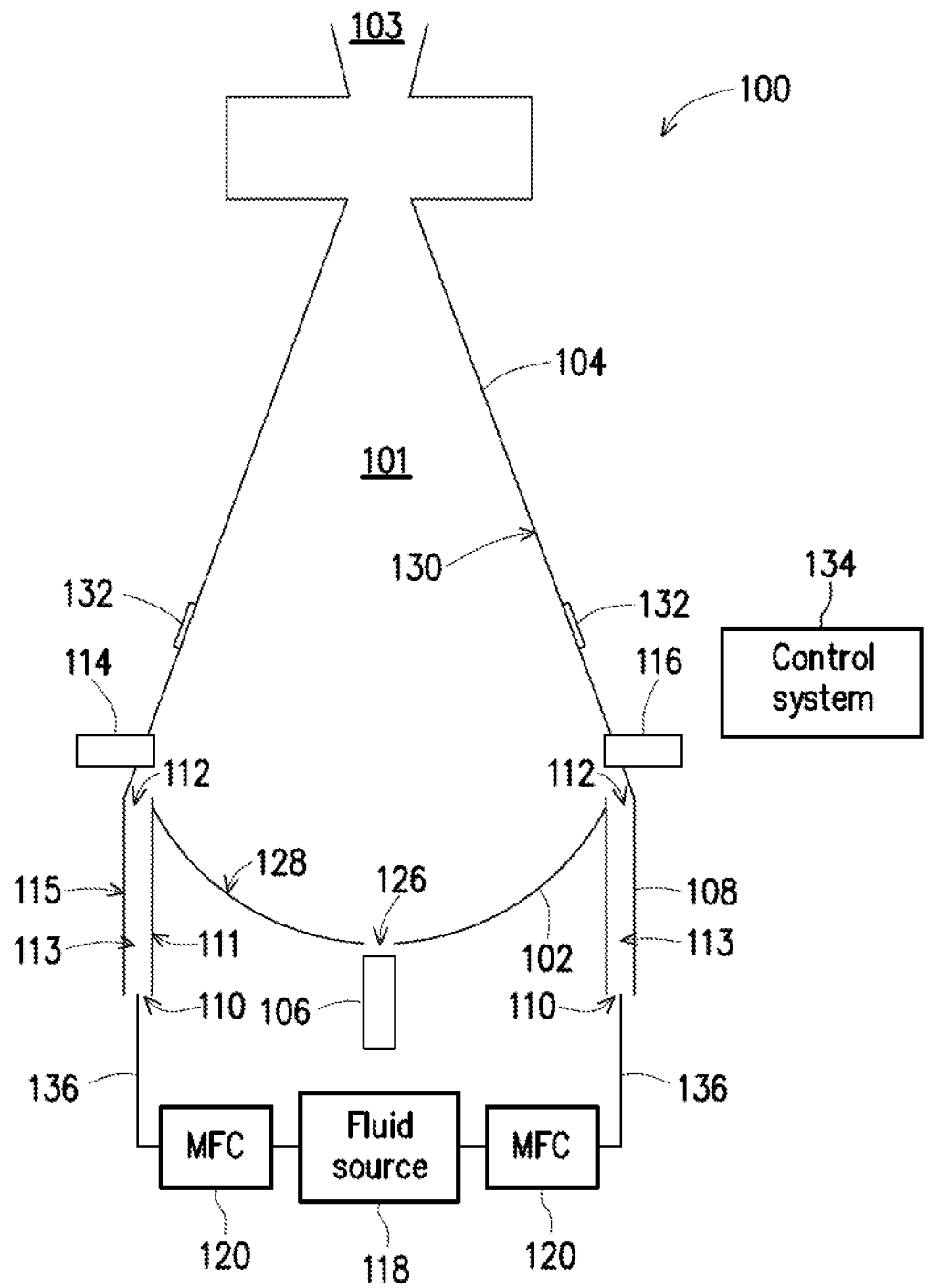
FIG. 1A is a side view of a photolithography system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits to extreme ultraviolet radiation photolithography systems. Embodiments of the present disclosure reduce contamination of components of the extreme ultraviolet photolithography systems. Embodiments of the present disclosure dynamically adjust the flow of a buffer fluid into an extreme ultraviolet radiation generation chamber. The buffer fluid helps to prevent and remove contamination of sensitive components of the extreme ultraviolet radiation generation chamber. This helps to ensure that photolithography processes have adequate extreme ultraviolet radiation. Furthermore, because contamination is removed and prevented, sensitive components of the extreme ultraviolet radiation systems do not have to be replaced as frequently. The sensitive components can be extremely expensive. Accordingly embodiments of the present disclosure not only enhance the effectiveness of photolithography processes, but they also reduce the cost of operating a photolithography systems because components need to be replaced less frequently.

FIG. 1A is a side view of an extreme ultraviolet (EUV) photolithography system 100, in accordance with one embodiment. FIG. 1A illustrates the EUV photolithography system 100 in a non-operational state. The EUV photolithography system 100 includes a collector mirror 102 and a shield 104. The collector mirror 102 and the shield 104 are coupled together to form an EUV generation chamber 101. EUV light is generated in the EUV generation chamber 101. The EUV light is passed from the EUV generation chamber 101 to the scanner 103. The EUV light irradiates a photolithography target in the scanner 103 via a mask.

In one embodiment, the photolithography system 100 is a laser produced plasma (LPP) EUV radiation photolithography system. The photolithography system 100 includes a laser 106, a droplet generator 114, and a droplet receiver 116. The laser 106, the collector mirror 102, and the droplet generator 114 cooperate to generate EUV radiation within the EUV generation chamber 101.

As will be described in greater detail in relation to FIG. 1B, the droplet generator 114 generates and outputs a stream of droplets. The droplets can include, in one example, liquid (melted) tin. Other materials can be used for the droplets without departing from the scope of the present disclosure. The droplets move at a high rate of speed toward the droplet receiver 116. The photolithography system 100 utilizes the droplets to degenerate EUV light for photolithography processes. Extreme ultraviolet light typically corresponds to light with wavelengths between 1 nm and 125 nm.

The photolithography system 100 includes a fluid distributor 108. The fluid distributor 108 includes a plurality of inlets 110 and an outlet 112. The fluid distributor 108 includes an inner wall 111 and an outer wall 115. The inner wall 111 and the outer wall 115 define a fluid chamber 113. As will be described in more detail in relation to FIG. 1B and other figures, the fluid distributor 108 receives a buffer fluid at the inlets 110, the buffer fluid flows through the fluid chamber 113 and is supplied into the EUV generation chamber 101 via the outlet 112. The buffer fluid helps to reduce and remove contamination of the collector mirror 102 and the shield 104.

The photolithography system 100 includes a fluid source 118 and mass flow controllers 120. The fluid source 118 stores the buffer fluid. The mass flow controllers 120 receive the buffer fluid from the fluid source 118 and supply the buffer fluid to the fluid distributor 108. In one embodiment, each mass flow controller 120 is coupled to a respective inlet 110 of the fluid distributor 108 via a respective fluid line 136. Alternatively, the mass flow controllers 120 can be positioned in the inlets 110. The mass flow controllers control the flow rate of the buffer fluid into the fluid distributor 108.

The photolithography system 100 includes sensors 132. The sensors 132 can be positioned external to the EUV generation chamber 101, within the EUV generation chamber 101, or partially within and partially outside of the EUV generation chamber 101. The sensors 132 can include light sensors, electron sensors, plasma sensors, or other kinds of sensors for sensing conditions within the EUV generation chamber 101. The photolithography system 100 can include an array of various types of sensors 132 positioned at various locations within and without the EUV generation chamber 101.

The photolithography system 100 includes a control circuit 134. The control circuit 134 is coupled to the droplet generator 114, a droplet receiver 116, the laser 106, the fluid source 118, and the mass flow controllers 120. The control circuit 134 controls the various components of the photolithography system 100. As will be described in more detail below, the control system 134 can operate the various components of the photolithography system 100 to reduce contamination of the reflector surface 128 of the collector mirror 102 and the interior surface 130 of the shield 104.

Figure 1B:
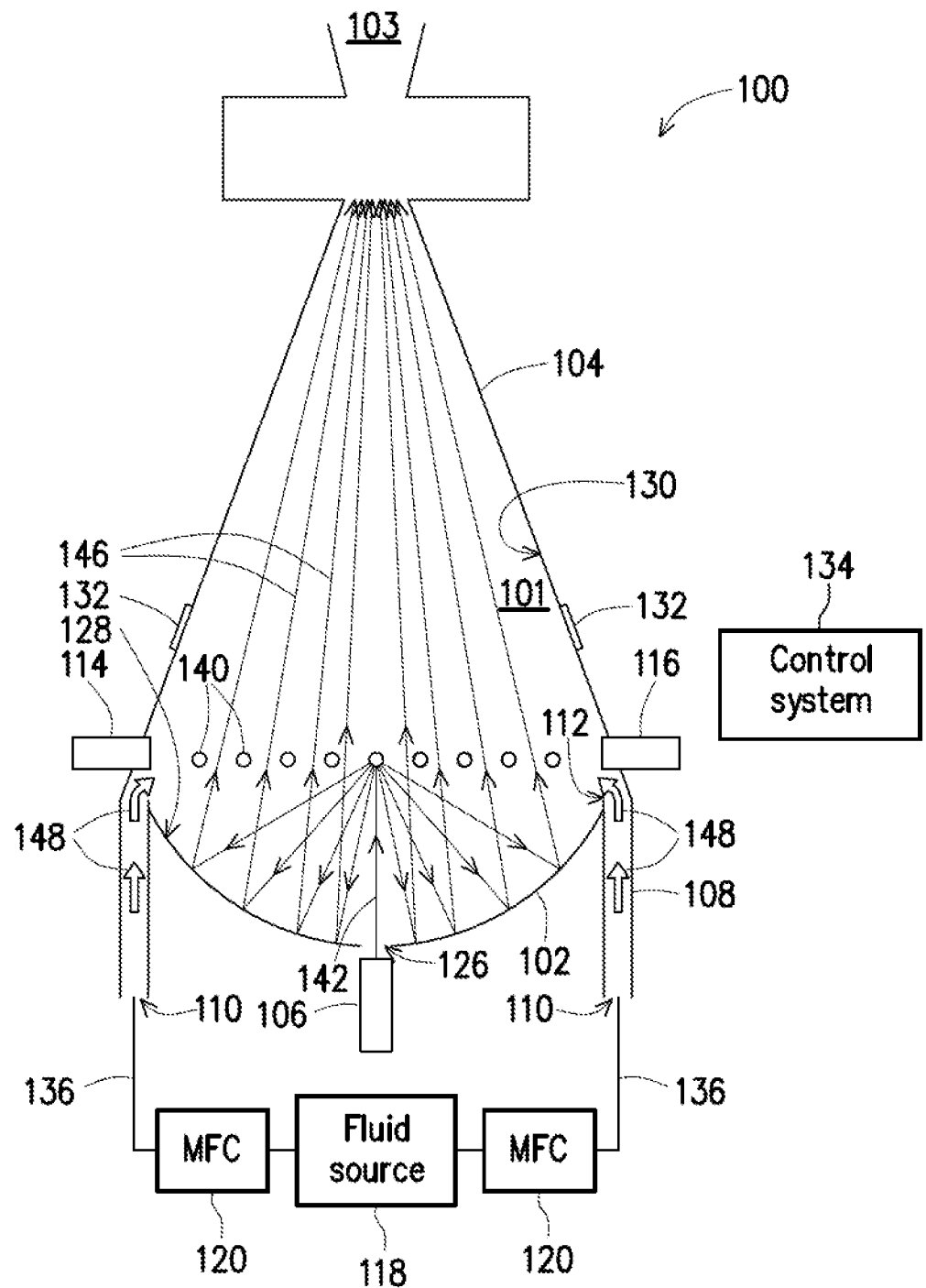
FIG. 1B is a side view of the photolithography system of FIG. 1A in an operational state, according to one embodiment.

FIG. 1B is an illustration of the photolithography system 100 of FIG. 1A in an operational state, according to one embodiment. In the operational state, the droplet generator 114 generates and outputs a stream of droplets 140. The droplets can include tin, though droplets of other material can be utilized without departing from the scope of the present disclosure. The droplets 140 move at a high rate of speed toward the droplet receiver 116.

In one embodiment, the droplet generator 114 generates between 40,000 and 100,000 droplets per second. The droplets 140 have an initial velocity of between 60 m/s to 200 m/s. The droplets have a diameter between 10 μm and 200 μm. The droplet generator 114 can generate different numbers of droplets per second than described above without departing from the scope of the present disclosure. The droplet generator 114 can also generate droplets having different initial velocities and diameters than those described above without departing from the scope of the present disclosure.

The laser 106 is positioned behind the collector mirror 102. During operation, the laser 106 outputs pulses of laser light 142. The pulses of laser light 142 are focused on a point through which the droplets pass on their way from the droplet generator 114 to the droplet receiver 116. Each pulse of laser light 142 is received by a droplet 140. When the droplet 140 receives the pulse of laser light 142, the energy from the laser pulse generates a high-energy plasma from the droplet 140. The high-energy plasma outputs EUV radiation.

In one embodiment, the laser 106 is a carbon dioxide ($CO_2$) laser. The $CO_2$ laser emits radiation or laser light 142 with a wavelength centered around 9.4 μm or 10.6 μm. The laser 106 can include lasers other than carbon dioxide lasers and can output radiation with other wavelengths than those described above without departing from the scope of the present disclosure.

In one embodiment, the laser 106 irradiates each droplet 140 with two pulses. A first pulse causes the droplet 140 to flatten into a disk like shape. The second pulse causes the droplet 140 to form a high temperature plasma. The second pulse is significantly more powerful than the first pulse. The laser 106 and the droplet generator 114 are calibrated so that the laser 106 emits pairs of pulses such that each droplet 140 is irradiated with a pair of pulses. For example, if the droplet generator 114 outputs 50,000 droplets per second, the laser 106 will output 50,000 pairs of pulses per second. The laser 106 can irradiate droplets 140 in a manner other than described above without departing from the scope of the present disclosure. For example, the laser 106 may irradiate each droplet 140 with a single pulse or with more pulses than two. Moreover, the primary laser here can not only cause droplets to flatten into disk-like shape can be mist or vapor state.

In one embodiment, the droplets 140 are tin. When the tin droplets 140 are converted to a plasma, the tin droplets 140 output EUV radiation 146 with a wavelength centered between 10 nm and 15 nm. More particularly, in one embodiment, the tin plasma emits EUV radiation with a central wavelength of 13.5 nm. These wavelengths correspond to EUV radiation. Materials other than tin can be used for the droplets 140 without departing from the scope of the present disclosure. Such other materials may generate EUV radiation with wavelengths other than those described above without departing from the scope of the present disclosure.

In one embodiment, the radiation 146 output by the droplets scatters randomly in many directions. The photolithography system 100 utilizes the collector mirror 102 to collect the scattered EUV radiation 146 from the plasma and output the EUV radiation toward a photolithography target.

In one embodiment, the collector mirror 102 is a parabolic or elliptical mirror. The scattered radiation 146 is collected and reflected by the parabolic or elliptical mirror with a trajectory toward the scanner 103. The scanner 103 utilizes a series of optical conditioning devices such as mirrors and lenses to direct the EUV radiation to the photolithography mask. The EUV radiation 146 reflects off of the mask onto a photolithography target. The EUV radiation 146 reflected from the mask patterns a photoresist or other material on a semiconductor wafer. For purposes of the present disclosure, particularities of the mask and the various configurations of optical equipment in the scanner 103 are not shown.

In one embodiment, the collector mirror 102 includes a central aperture 126. The pulses of laser light 142 pass from the laser 106 through the central aperture 126 toward the stream of droplets 140. This enables the collector mirror 102 to be positioned between the laser 106 and the photolithography target.

Because the droplets 140 traveled a high rate of speed are either in a liquid or plasma state, when the droplets 140 are received into the droplet receiver 116, there may be a splash effect. It is possible that some splash back may occur. The splash back may result in material from the droplets 140 landing on the reflective surface 128 of the collector mirror 102 or on the interior surface 130 of the shield 104. Additionally, it is possible that when the droplets 140 are irradiated with laser light 142, that some plasma vapor may be generated. The plasma vapor 140 may eventually deposit on the surface 128 of the collector mirror 102 and on the interior surface 130 of the shield 104.

The accumulation of material from the droplets 140 on the surface 128 of the mirror 102 and on the interior surface 103 of the shield 104 may result in poor performance of the photolithography system 100. For example, the photolithography system 100 depends on a sufficient amount of EUV light 146 being reflected from the collector mirror 102 into the scanner 103. If an insufficient amount of EUV light 146 is reflected from the collector mirror 102 into the scanner 103, then the photolithography system 100 may not be able to properly perform a photolithography process. When material from the droplets 140 accumulates on the reflective surface 128 of the collector mirror 102, then the reflectivity of the reflective surface 128 is reduced. This can result in an insufficient amount of EUV light 146 being provided to the scanner 103. Furthermore, accumulation of material on the interior surface 130 of the shield 104 can also have an adverse impact on the performance of the photolithography system 100.

The photolithography system 100 implements the fluid distributor 108 in order to reduce the accumulation of material from the droplets 140 on the surface 128 of the mirror 102 and on the interior surface 130 of the shield 104. The fluid distributor 108 distributes a buffer fluid 148 into the EUV generation chamber 101. The buffer fluid 148 is selected to remove accumulated droplet material from the surface 128 of the mirror 102 and the interior surface 130 of the shield 104. The buffer fluid 148 is also selected to inhibit material from the droplets 140 from accumulating on the reflective surface 128 and on the interior surface 130.

In one embodiment, the droplets 140 are tin and the buffer fluid 148 is a hydrogen gas. The hydrogen gas can include H2. The hydrogen gas reacts with the tin and etches accumulated tin material from the surfaces 128 and 130. Accordingly, one effect of the hydrogen buffer fluid is to chemically react with the tin in order to remove the tin from the surfaces 128 and 130. Another effect of the hydrogen buffer fluid 148 is to physically carry tin material away from the surfaces 128 and 130. In other words, the flow of the hydrogen buffer fluid 148 can physically carry tin material away from the surfaces 128 and 130. One example has been given in which the droplets 140 are tin in the buffer fluid 148 is hydrogen gas, other materials from the droplets 140 and other buffer fluids 148 can be used without departing from the scope of the present disclosure.

One challenge associated with reducing the accumulation of material on the surfaces 128 and 130 is the uneven flow of the buffer fluid 148 along the various regions of the surfaces 128 and 130. If the buffer fluid 148 does not flow along all areas of the surfaces 128 and 130, then it is possible that material from the droplets 140 may accumulate at these regions of buffer fluid flow.

In order to promote sufficient flow of the buffer fluid 140 along all areas of the surfaces 128 and 130, the fluid distributor 108 includes a plurality of inlets 110. In particular, the fluid distributor 108 includes four or more inlets 110. The inlets 110 can be positioned evenly along the lower surface of the fluid distributor 108. The large number of inlets 110 and the even spacing of the large number of inlets 110 can result in a more even flow of the buffer fluid 148 at all positions of the outlet 112. This dynamic may be better understood with reference to FIGS. 1C and 1D.

Figure 1C:
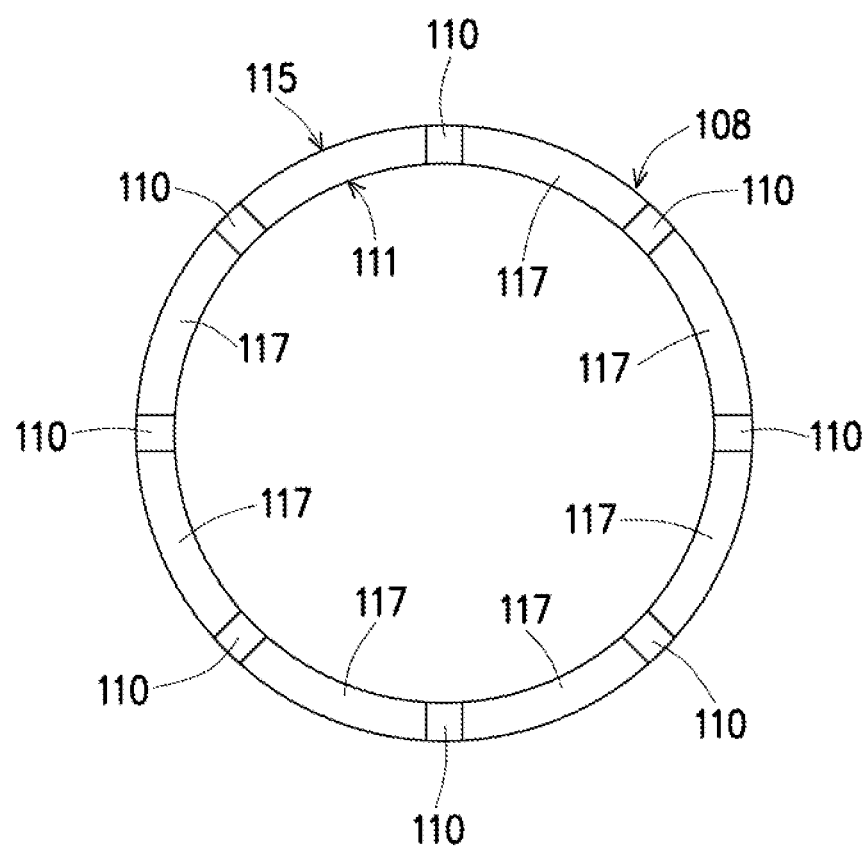
FIG. 1C is a bottom view of a fluid distributor of the photolithography system of FIG. 1A, according to one embodiment.

FIG. 1C is a bottom view of the fluid distributor 108 of FIGS. 1A and 1B, according to one embodiment. In the example of FIG. 1C, the fluid distributor 108 includes eight inlets 110. The eight inlets 110 each receive a flow of the buffer fluid 148 from a respective fluid line 136 (not shown in FIG. 1C). The fluid or sugar 108 includes a solid bottom surface 117. The solid bottom surface 117 prevents flow of fluid into the fluid chamber 113 of the fluid distributor 108 except through the inlets 110. Other numbers and shapes of inlets 110 can be utilized without departing from the scope of the present disclosure. In order to promote uniform coverage of gas flow on the various regions of the surfaces 128 and 130, it can be beneficial to have a number of inlets 110 that enables symmetrical positioning of the inlets 110.

Figure 1D:
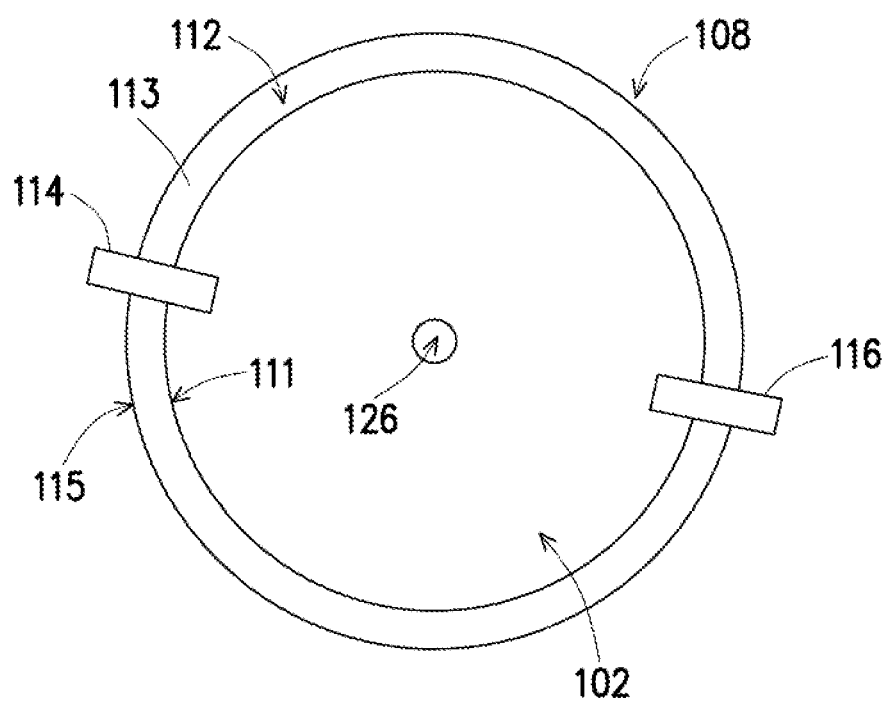
FIG. 1D is a top view of a portion of the photolithography system of FIG. 1A, according to one embodiment.

FIG. 1D is a top view of a portion of the fluid distributor 108 and the collector mirror 102 of FIG. 1A, according to one embodiment. In the example of FIG. 1D, the top of the fluid distributor 108 is entirely open between the inner wall 111 and the outer wall 115. In other words, the top of the fluid distributor 108 corresponds to a single continuous outlet 112 that enables the buffer fluid 148 to flow from the fluid chamber 113 into the EUV generation chamber 101. Other configurations of a fluid distributor 108 can be utilized without departing from the scope of the present disclosure. For example, the fluid distributor 108 may include a plurality of individual outlets 112 separated from each other by a solid top surface. The top view of FIG. 1D also illustrates the droplet generator 114 and the droplet receiver 116. The top view of FIG. 1B does not illustrate the shield 104.

The buffer fluid 148 flows into the fluid chamber 113 of the fluid distributor 108 via the inlets 110. The buffer fluid 148 flows from the fluid chamber 138 into the EUV generation chamber 101 via the continuous outlet 112. This configuration promotes substantial flow of the buffer fluid 148 along all regions of the surfaces 128 and 130

In one embodiment, the flow of the buffer fluid 148 from the fluid source 118 into each fluid line 136 may be controlled by a respective mass flow controller 120. Each mass flow controller 120 can be selectively operated to provide a selected flow of the buffer fluid 148 into the respective inlet 110 via the corresponding fluid line 136. In one embodiment, the mass flow controllers 120 are each positioned within a respective inlet 110. In this case, the fluid lines 136 deliver fluid from the fluid source 118 to the inlets 110. The mass flow controllers 120 control the flow rate of the buffer fluid 148 into the fluid chamber 113.

Figure 2:
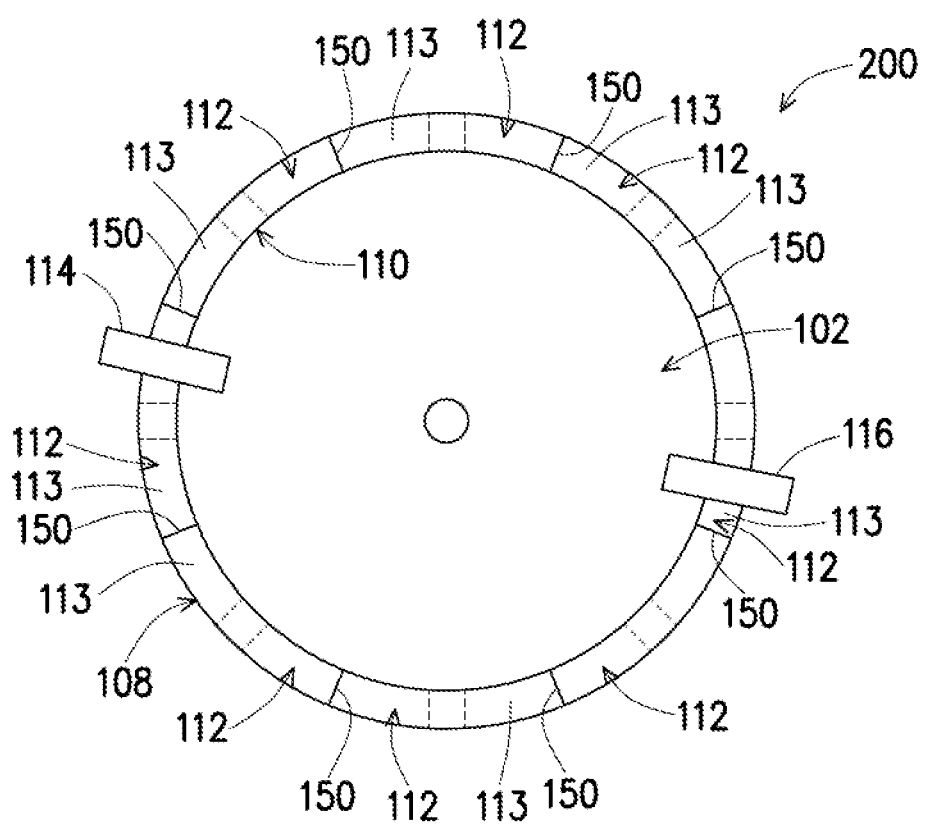
FIG. 2 is a top view of a portion of a photolithography system, according to one embodiment.

FIG. 2 is a top view of a portion of a photolithography system 200, according to one embodiment. The photolithography system 200 is substantially similar to the photolithography system 100 of FIGS. 1A-1D, except that the fluid distributor 108 includes multiple mutually exclusive fluid chambers 113. The mutually exclusive fluid chambers 113 are defined by internal partitions 150. The internal partitions 150 extend from the bottom surface 117 (see FIG. 1C) of the fluid distributor 108 to a top of the fluid distributor 108. Each fluid chamber 113 receives the buffer fluid 148 through a respective inlet 110. The inlets 110 are shown in dashed lines.

The fluid distributor 108 of FIG. 2 includes a plurality of outlets 112. Each outlet 112 extends between two of the internal partitions 150. Accordingly, each fluid chamber 113 outputs the buffer fluid 148 through a respective outlet 112.

In one embodiment, the fluid distributor 108 of FIG. 2 enables enhanced control of buffer fluid flow from particular regions of the fluid distributor 108. As will be set forth in more detail below, the control circuit 134 may determine that flow rates of the buffer fluid 148 should vary at different output regions of the fluid distributor 108. In this case, the control system 134 can selectively control the various mass flow controllers 120 can provide varying flow rates of the buffer fluid 148 into the individual fluid chambers 113 via the inlets 110. Because the fluid chambers 113 are separated from each other by the internal partitions 150, selectively controlling the mass flow controllers 120 enables selectively controlling the flow of the buffer fluid 148 from various parts of the fluid distributor 148.

Figure 3A:
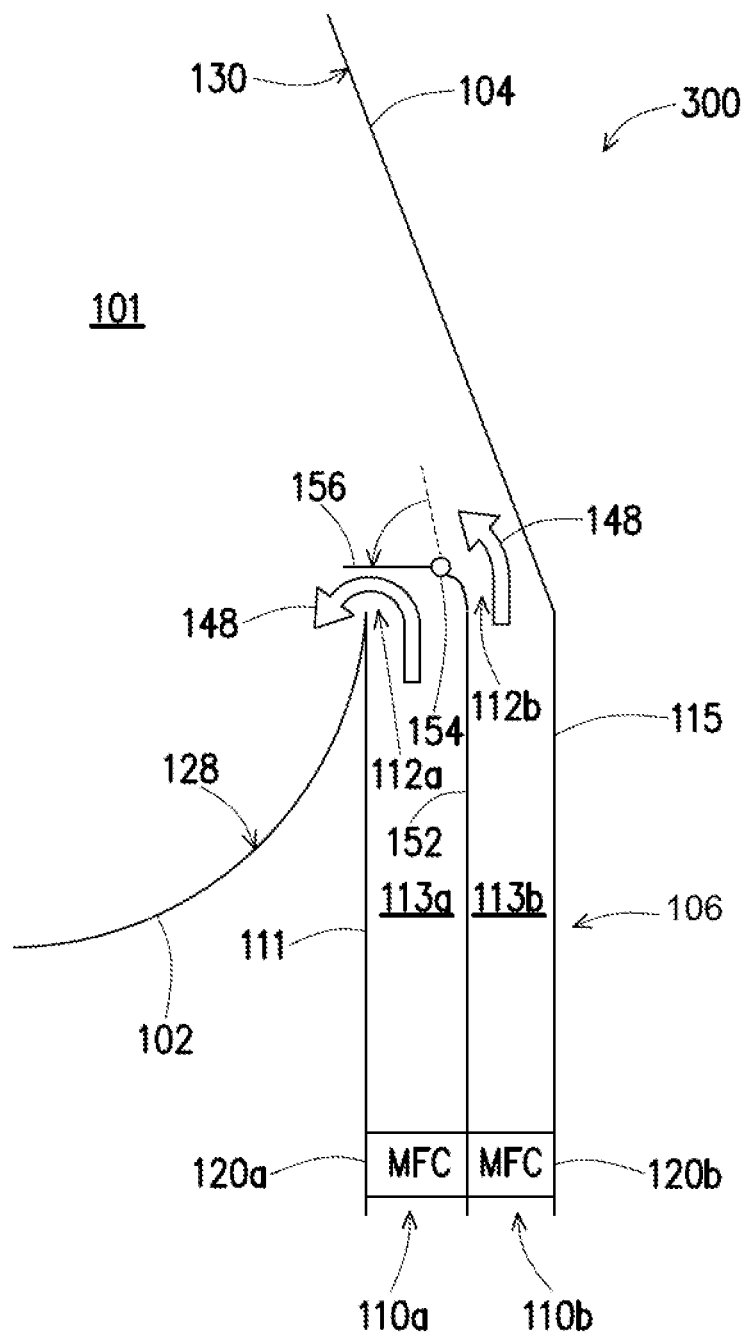
FIG. 3A is a side view of a portion of a photolithography system, according to one embodiment.

FIG. 3A is an enlarged sectional view of a portion of a photolithography system 300, according to one embodiment. The photolithography system 300 can be substantially similar to the photolithography system 100 of FIGS. 1A-1D, except that the fluid distributor 108 of the photolithography system 300 includes some additional features with respect to the fluid distributor 108 of FIGS. 1A-1D. In particular, the fluid distributor 108 includes an internal partition 180. The internal partition 180 separates a first fluid chamber 113a from a second fluid chamber 113b within the fluid distributor 108. The disposition of the internal partition 180 can be more fully understood with reference to FIG. 3B.

Figure 3B:
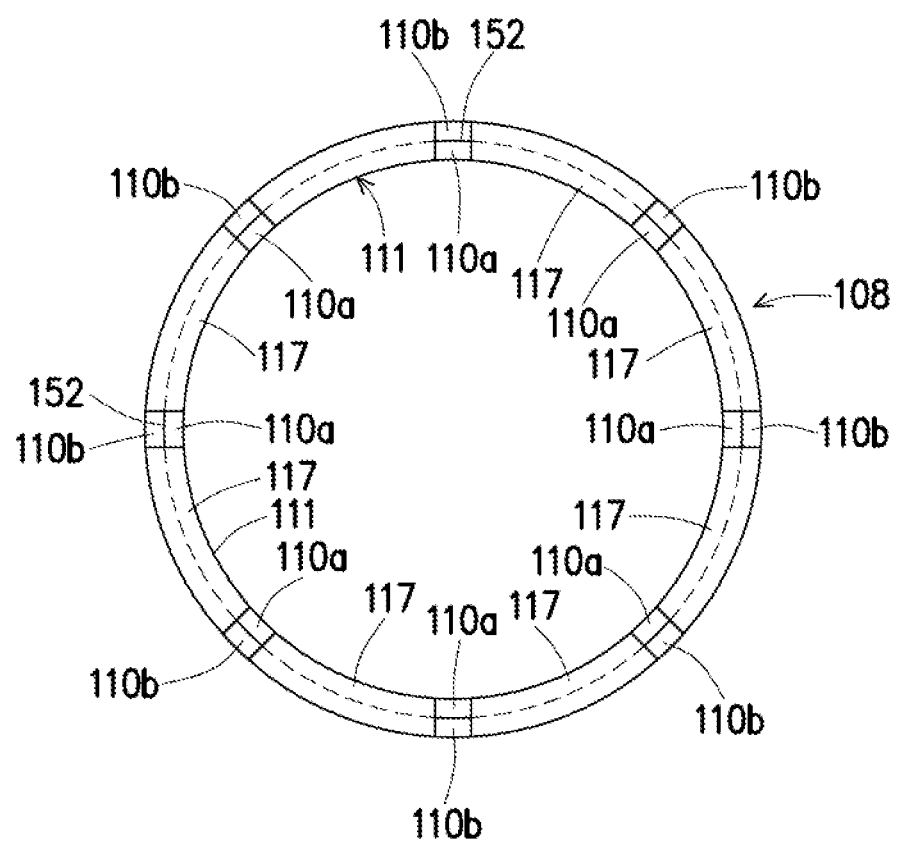
FIG. 3B is a bottom view of a fluid distributor of the photolithography system of FIG. 3A, according to one embodiment.

FIG. 3B is a bottom view of the fluid distributor 108 of FIG. 3A, according to one embodiment. FIG. 3B illustrates that the internal partition 180 separates a plurality of inlets 110a from a plurality of inlets 110b. Furthermore, the partition 180 is shown in dashed lines where the partition 180 is covered from view by the bottom surface 117 of the fluid distributor 108. Accordingly, in one embodiment, the internal partition 180 extends in a circle between the inner wall 111 and the outer world wall 115. Though not illustrated in FIGS. 3A, the fluid distributor 108 can also include internal partitions 150 as shown in FIG. 2.

Returning to FIG. 3A, a mass flow controller 120a is positioned in the inlet 110a. A mass flow controller 120b is positioned in the inlet 110b. Each inlet 110 a can include a mass flow controller 120a. Each inlet 110b can include a mass flow controller 120b. In an example in which the internal partitions 150 are not present, there is a single continuous first fluid chamber 113a and the single continuous second fluid chamber 113b. Each of the inlets 110a, with the mass flow controllers 120a, provides the buffer fluid 148 into the first fluid chamber 113a. Each of the inlets 110b, with the mass flow controllers 120b, provides the buffer fluid 148 into the second fluid chamber 113b. As will be described in more detail below, the mass flow controllers 110a, 110b can be selectively operated to provide varying flow rates of the buffer fluid 148 into the first and second fluid chambers 113a, 113b. Each of the inlets 110a, 110b can receive the buffer fluid 148 from respective fluid lines 136 (not shown). In some embodiments, the mass flow controllers 120a, 120b are positioned external to the inlets 110a, 110b. The fluid distributor 108 includes a first outlet 112a that provides the buffer fluid 148 from the first fluid chamber 113a into the EUV generation chamber 101. The fluid distributor 108 includes a second outlet 112b that provides the buffer fluid 148 from the second fluid chamber 113b into the EUV generation chamber 101.

The photolithography system 300 includes a director vane 156. The director vane 156 is rotatably coupled to a joint 154. The director vane 156 can rotate through various positions via the joint 154. The director vane 156 can help direct buffer fluid 148 along the surface 130 of the shield 104 and the surface 128 of the collector mirror 102. As will be described in more detail below, the control system 134 can control the position of the director vane 156. Accordingly, the director vane 156 can selectively affect the flow of the buffer fluid 148 from the outlets 112a, 112b.

Though not shown in FIG. 3A, the photolithography system 300 can include a plurality of director vanes 156 positioned around the top of the fluid distributor 108. Each of the vanes 156 can be selectively controlled to direct the flow of buffer fluid 148. In an example in which the internal partitions 150 are present, there may be a plurality of first fluid chambers 113a and second fluid chambers 113b, and corresponding first outlets 112a and second outlets 112b. There may be a respective director vane 156 for each pair of first and second outlets 112a, 112b. The director vanes 156 may have a width corresponding to the distance between internal partitions 150.

FIG. 4 is an illustration of a photolithography system 400, according to one embodiment. The photolithography system 400 is substantially similar to the photolithography system 100 of FIGS. 1A-1D, except that the photolithography system 400 includes the particular array of light sensors 162 and charge coupled devices 160. Though not shown in FIG. 4, the photolithography system 400 also includes the droplet generator 114 and the droplet receiver 116.

In one embodiment, the light sensors 162 are positioned to detect side scattering of EUV radiation from the plasmatized droplets 140. The light sensors 162 can be part of a side scatter detection system 116 as described in relation to FIG. 1.

In one embodiment, the light sensors 162 collectively detect a current level of intensity of EUV light being generated in the EUV generation chamber 101. A plurality of light sensors 162 can be positioned laterally around the outside of the shield 104 at various heights. The plurality of light sensors 162 are configured to sense EUV light. The light sensors 160 to provide sensor signals to the control system 134. The control system 134 can analyze the sensor signals from the light sensors 162 to determine the reflectivity of various regions of the surface 128 of the collector mirror 102 and the surface 130 of the shield 104. As will be set forth in more detail below, the control system 134 can utilize these determinations to selectively increase the flow of the buffer fluid 148 to regions of the surface 128 and the surface 130 on which are accumulated matter from the droplets 140. The control system 134 can control the mass flow controllers 120, the director vanes 156, and other aspects of the photolithography system 400 in order to remove accumulated droplet material from the surfaces 128 and 130.

In one embodiment, the light sensors 162 are utilized to detect Thomson scattering of EUV radiation from the plasmatized droplets. The Thomson scattering phenomenon is due to elastic scattering of electromagnetic radiation by a single free charged particle. This can be utilized as a high temperature plasma diagnostic technique. In particular, Thomson scattering measurements can be utilized to determine the ionization rate in the droplets. The intensity of scattered light is based, in part, on the extent of the laser to plasma interaction. Accordingly, the ionization rate can be retrieved from the intensity of scattered light. Thomson scattering intensity is independent of incident light wavelength. Thus, Thomson scattering can be useful to analyze the relationship between the electric field of incident light and electron density. The light sensors 162 generate signals indicative of the intensity of side scattered light and pass the signals to the control system 134.

In one embodiment, the light received by the light sensors 162 can be utilized to determine a shape of the droplets 140 after being impacted by a first pulse of laser light 142 and the second pulse of laser light 144. In general, the first pulse of laser light flattens the receiving droplet 140 into a pancake shape. The pancake shaped droplet 140 can be tilted at various angles relative to the direction of travel of the droplets 140. The pancake shape angle of the droplet 140 can result in accumulation of droplet matter in particular locations on the surface 128 in the surface 130. Accordingly, the control system 134 can analyze the light received by the light sensors 162 to determine the shape and angle of the droplet 140 after being impacted by the first pulse of laser light 142 and after being impacted by the second pulse of laser light 142.

The total intensity of EUV light emitted by plasma can be estimated or calculated based on the amount of light received by the light sensors 162. On average, the plasma will emit EUV light at the same rate in all directions, or with known relationships between various scattering directions. Accordingly, the total intensity of EUV light can be estimated or calculated based on the light received by the light sensors 162.

In one embodiment, the light sensors 162 can be utilized to detect contamination of the surface 128 of the collector 102. The reflectivity of the surface 102 will be reduced at contaminated areas. Accordingly, a subset of the light sensors 162 and/or other light sensors positioned in the scanner can be utilized to determine the reflectivity each of a plurality of areas on the surface 128 of the collector 102. The light sensor information can be utilized to generate a contamination map. The contamination map indicates the contamination level of each area of the surface 128. The control system 134 can generate the contamination map based on sensor signals received from the light sensors 162 and/or other sensors.

In one embodiment, the control system can adjust buffer fluid flow parameters to provide increased buffer fluid flow to those regions of the surface 128 that are more heavily contaminated. The control system 134 can selectively control the mass flow controllers 110 and the director vanes 156 to increase or decrease the flow of the buffer fluid onto the various areas of the surface 128 based on the contamination map.

In one embodiment, the photolithography system 400 includes a plurality of lenses 164. Each lens 164 is positioned to focus light scattered from the plasmatized droplets 140 onto or into the light sensors 162. Though the lenses 164 are shown as being positioned external to the EUV generation chamber 101, in practice, the lenses 164 may be positioned in other locations or orientations than those shown in FIG. 4.

In one embodiment, the one or more lenses 164 are coupled to a rim of the collector mirror 102. The lenses 164 can be positioned in a same lateral plane as the droplet generator 114 and droplet receiver 116. Side scattered light from the plasma droplets passes through these lenses 164 and is focused onto the light sensors 162.

In one embodiment, the one or more lenses 164 can correspond to windows in the shield 104 of the EUV generation chamber 101. Accordingly, a shield 104 of the EUV generation chamber 101 can include windows or apertures. Lenses 164, or lensing materials, can be positioned in the windows or apertures. When light is scattered from the plasma, the light passes through the windows and onto the light sensors. The lenses 164 positioned in the windows or apertures can focus the light onto the light sensors 162.

In one embodiment, the light sensors 162 provide sensor signals to the control system 134. The sensor signals are indicative of the intensity of light received by the light sensors 162. The control system 134 receives the sensor signals and can adjust parameters of the photolithography system 400 responsive to the sensor signals.

In one embodiment, the control system 134 adjust parameters of the photolithography system 400 in order to more effectively prevent and remove accumulations of droplet matter on the surfaces 128 and 130. In one embodiment, the control system 134 adjusts parameters of the photolithography system 400 in order to more effectively generate EUV radiation. The control system 134 can adjust one or more of buffer fluid flow rates into various inlets 110, the positions of director vanes 156, droplet speed, droplet size, laser pulse power, laser pulse timing, laser pulse train profile, initial droplet temperature, pressure within the EUV generation chamber, or other parameters.

In one embodiment, adjusting aspects of the laser pulses can include adjusting the plasma generation pulse that generates the plasma from the flattened droplet 140. The plasma generation pulse is utilized to generate a plasma from the flattened droplet. The timing, pulse shape, and power of the plasma generation pulse can be adjusted by the control system 134 responsive to the sensor signals from the light sensors 162.

In one embodiment, the photolithography system includes charged particle detectors 160. The process of generating a plasma results in the generation of charged particles in the droplets 140. Some of the charged particles may be ejected from or may otherwise travel away from the droplets. The characteristics of the charged particles ejected from the plasma are indicative of characteristics of the plasma itself. The characteristics of the charged particles can include velocity of the charged particles, the energy of the charged particles, the trajectory of the charged particles, the number of charged particles emitted per droplet, and other characteristics.

In one embodiment, the charged particle detectors 160 are coupled to the control system 134. The charged particle detectors 160 are configured to generate sensor signals indicative of parameters of the charged particles. The charged particle detectors 160 pass the sensor signals to the control system 134.

In one embodiment, an array of charged particle detectors 160 is positioned within the EUV generation chamber 101. The array of charged particle detectors 160 can be positioned to detect a variety of charged particle trajectories within the EUV generation chamber 101. In other words, the charged particle detectors 160 can be positioned in various locations throughout the EUV generation chamber 101. Each of the charged particle detectors 160 detects impacts of charged particles on the charged particle detectors 160. The charged particle detectors 160 pass sensor signals indicative of characteristics of the charged particles to the control system 134.

Figure 4A:
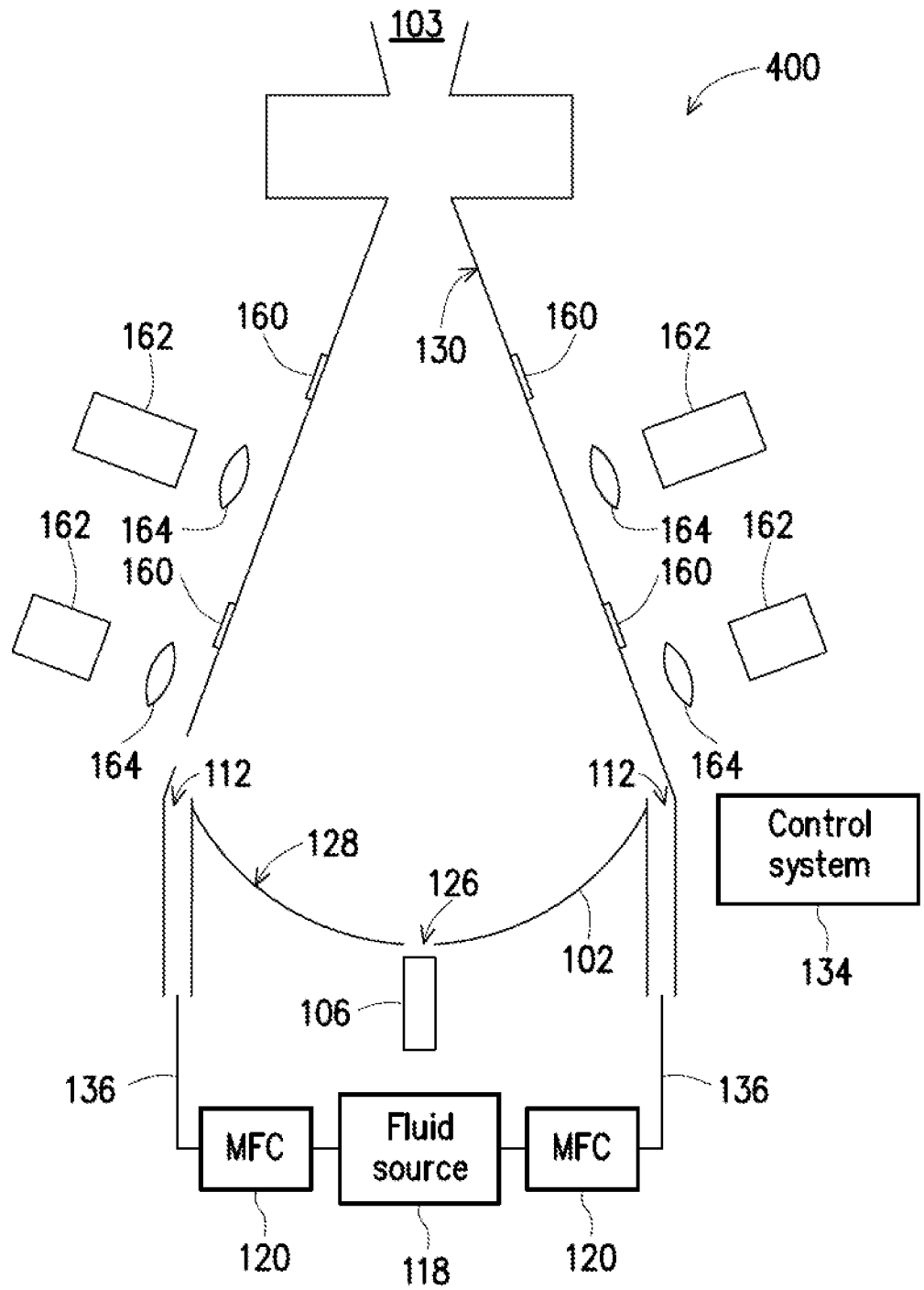
FIG. 4A is a side view of a photolithography system, according to one embodiment.

FIG. 4A illustrates the charged particle detectors 160 as being positioned on an exterior wall of the EUV generation chamber 101. However, the charged particle detectors 160 can be positioned within the EUV generation chamber 101. For example, the charged particle detectors 160 can be positioned on the interior surface 130 of the shield 104 of the EUV generation chamber 101. Alternatively, the charged particle detectors 160 can be positioned, supported, or arranged in other ways in an interior or an exterior of the EUV generation chamber 101. In one embodiment, the EUV generation chamber 101 can include apertures that permit charged particles to pass from an interior of the EUV generation chamber 101 to the charged particle detectors 160. In one embodiment, may include charged particle lenses that direct charged particles into the charged particle detectors 160 via electromagnetic forces.

In one embodiment, the charged particle detectors 160 include charge coupled devices configured to detect impacts from charged particles. The charge coupled devices generate signals each time a charged particle impacts the charge coupled devices. The charge coupled devices then pass sensor signals to the control system 134.

In one embodiment, the charge coupled devices for detecting charged particles include electron multiplying charge coupled devices. The electron multiplying charge coupled devices are frame transfer charge coupled devices that include an output register. The electron multiplying charge coupled device can include a fluorescent film or sheet positioned in front of a sensor area of the charge coupled device. When charged particles impact the florescent film, the florescent film emits light. The light is sensed by the charge coupled device and the charge coupled device counts the impact of the charged particle.

In one embodiment, the charged particle detectors can include Faraday cups. A Faraday cup is a conductive cup that is configured to detect or capture charged particles in a vacuum, such as a vacuum in the EUV generation chamber 101. The Faraday cup generates a current based on the charged particles captured by the Faraday cup. This current can be utilized to determine the number of charged particles that impact the cup. The Faraday cups can provide sensor signals to the control system 134 indicative of the number of charged particles collected or captured by the Faraday cups.

In one embodiment, the control system 134 can adjust parameters of the photolithography system 100 responsive to the sensor signals from the charged particle detectors 160. The control system 134 can adjust the same sorts of parameters of the photolithography system 400 as those described previously in relation to the light sensors 162. The control system 134 can adjust the parameters of the photolithography system 200 in order to more effectively generate EUV radiation for performing photolithography.

In one embodiment, the control system 134 can generate a 3D model of the droplets 140 after the flattening pulse and/or the plasma generation pulse. Because the charged particle detectors 160 are positioned in various locations throughout the EUV generation chamber 101 and/or the scanner 103, the sensor signals from the various charged particle detectors can be utilized to generate a 3D model of the droplets prior to injection of the charged particles. The 3D model can indicate a shape of the flattened droplets after the flattening pulse and before the plasma generation pulse. Alternatively, or additionally, the 3D model can indicate a shape of the flattened droplets after the plasma generation pulse. The control system 134 can analyze the 3D model in order to determine whether the flattening pulse, the plasma generation pulse, the droplet speed, droplet size, the initial droplet temperature, or other parameters should be adjusted in order to generate a plasma having a selected shape from the droplets. The 3D model can help predict where droplet material will accumulate on the surfaces 128 and 130. Accordingly, the control system 134 can utilize the 3D model to determine how to direct the flow of the buffer fluid 148.

In one embodiment, the control system 134 can adjust parameters of the photolithography system 400 responsive to sensor signals from the light sensors 162 and the charged particle detectors 160. The control system 134 can generate a model of the flattened droplets 140, the plasmatized droplets 140, or of other aspects of the plasma or droplets 140 based on the combination of sensor signals from both the light sensors 162 and the charged particle sensors 130, 136.

In one embodiment, the control system 134 utilizes machine learning to accurately adjust the parameters of the photolithography system 400 in order to avoid, reduce, or remove the accumulation of droplet matter on the surfaces 128 and 130. Accordingly, the control system 134 can include a machine learning model that can be trained to adjust one or more parameters of buffer fluid flow, the laser pulses, or droplets 140 responsive to sensor signals received from the light sensors 162 and/or the charged particle detectors 160.

In one embodiment, the machine learning model includes a neural network. The machine learning model can include one or more neural network-based supervised machine learning models. The machine learning model can include one or more unsupervised machine learning models. Other types of machine learning models can be utilized for controlling the speed of droplets without departing from the scope of the present disclosure. For example, machine learning models other than neural network-based machine learning models can be utilized by the control system 134.

The image generated from electron multiplying type charge coupled devices may need post processing due to different electron energies with different deflective directions. The image can include energy (distribution on image) and counts (intensity on image) information. Therefore, to recover an XY plane image to resolve original distribution, corrections may be made. By known optics specification, the position in a volume with a particular geometry can be estimated.

In one embodiment, by recording the information from Thomson scattering phenomenon and electron distribution in space, the original electron density distribution from the plasma could be computed in multiple dimensions. From Thomson scattering theory, the relation between incident light intensity and the electron density distribution can also be retrieved. By analyzing the relation of electrons distribution in space and combining the results in three dimensions, the control system 134 can compose a 3D plasma model.

In one example, the X-Y distribution of the plasma can be calculated based on side-scattered light information. The side scattered light information can be collected by light sensors 162 positioned near the collector mirror. The Z distribution of the plasma can be calculated based on the charged particle data sensed by the charged particle sensors 160 further away from the collector 102 in the vertical direction. Some of the charged particle sensors 160 may be positioned in the scanner or near the scanner. The 3D model may correspond to calculating the X-Y and Z distribution of the plasma, based on these parameters. The 3D model indicates the quality of the plasma. Accordingly, the control system 134 can generate the 3D plasma model based on sensor signals from the light sensors 162 and the charged particle sensors 160. The 3D models can be utilized to assist in identifying adjustments to the prepulse laser, the plasmatizing laser, and the droplets.

Figure 4B:
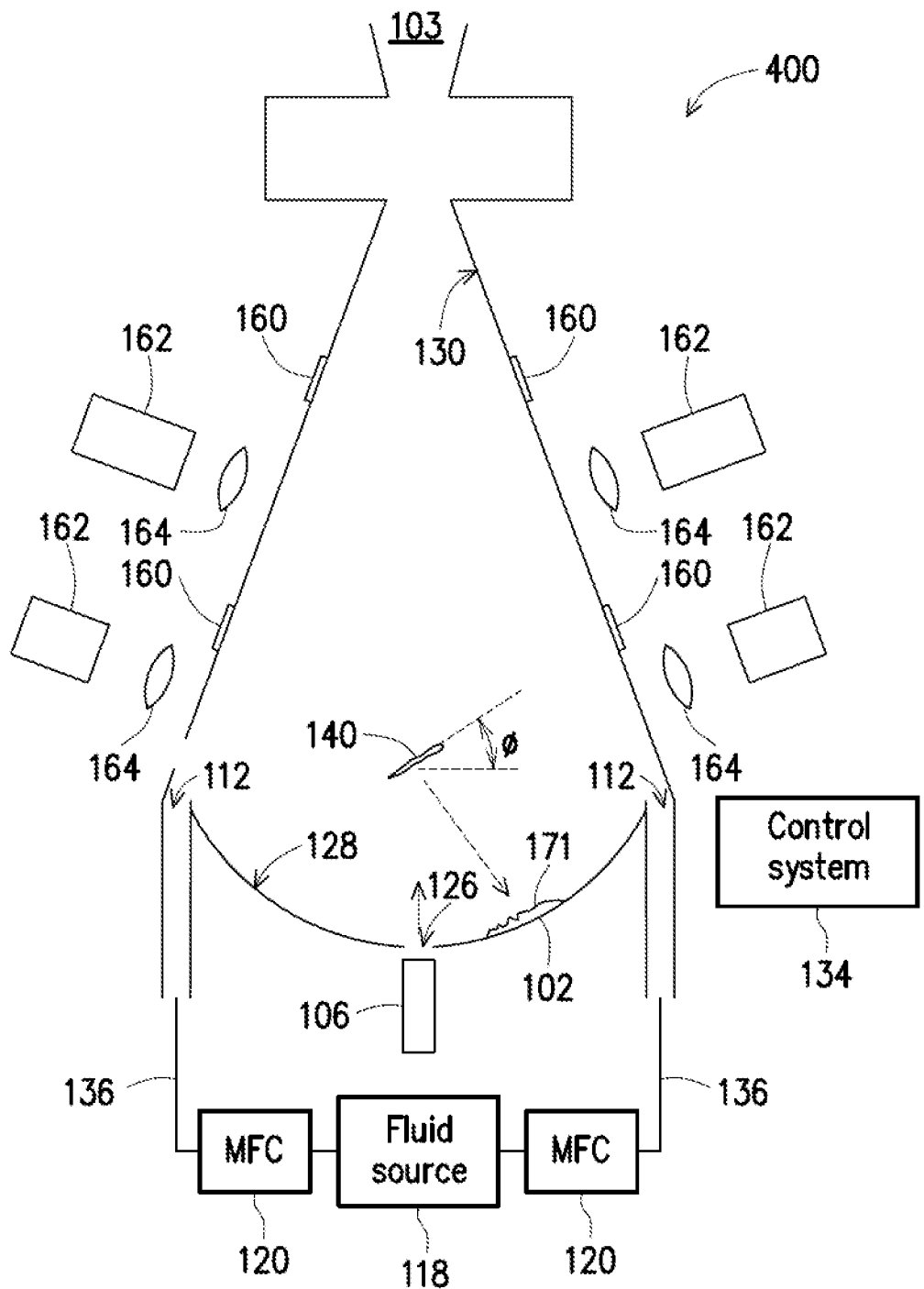
FIG. 4B is a side view of a photolithography system, according to one embodiment.

FIG. 4B is an illustration of the EUV photolithography system 400 of FIG. 4A and including a plasmatized droplet 140. The plasmatized droplet 140 has been plasmatized after receiving the plasma laser pulse from the laser 106. Plasmatized droplet 140 is flattened. The flattened droplet may be called a plasma pancake. The flattened droplet 140 is tilted at an angle Theta with respect to horizontal. The angle of the flattened droplet 140 can affect the location of accumulated contamination 171 on the surface 128 of the collector 102. The 3D model of the plasma described previously indicates the tilt angle Theta. Accordingly, the 3D model can be utilized to predict the location of accumulation of contamination 171.

Figure 4C:
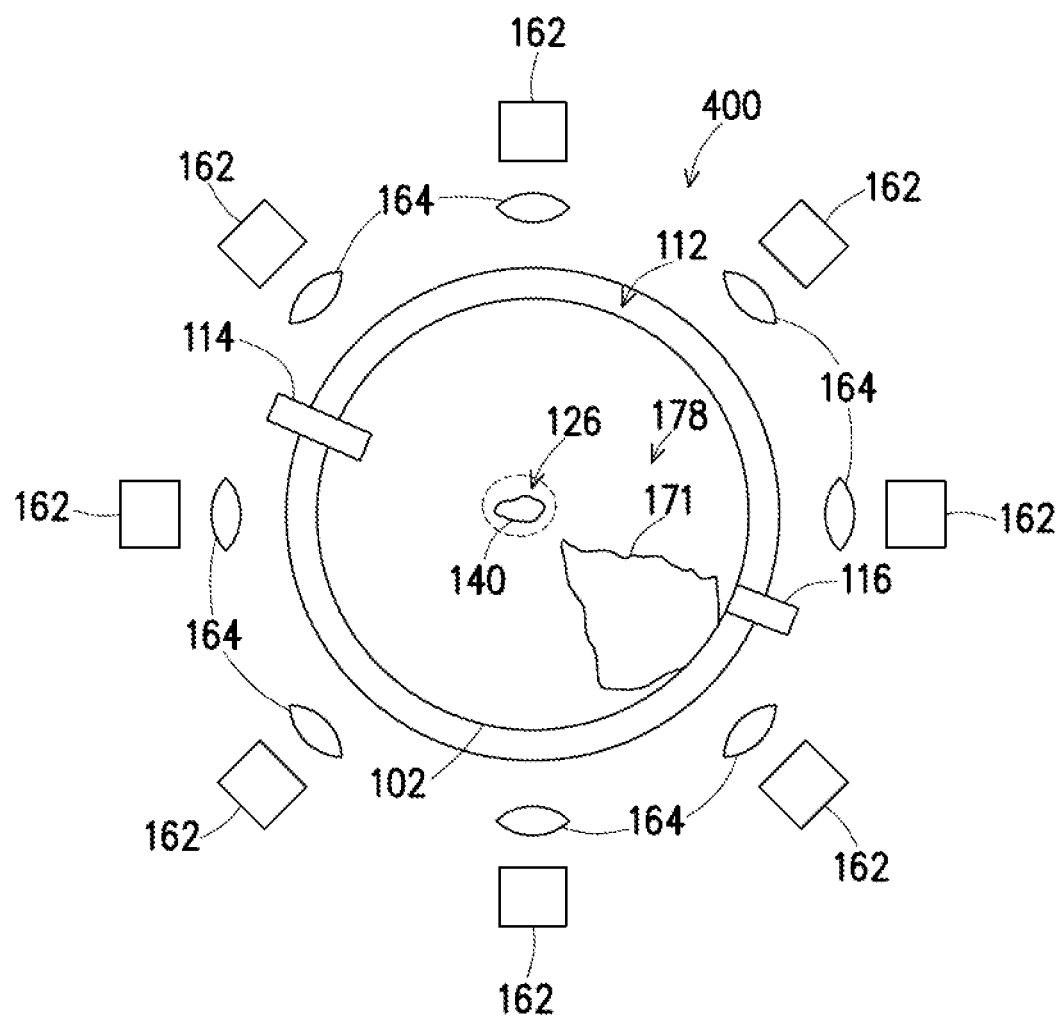
FIG. 4C is a top view of the photolithography system of FIG. 4B, according to one embodiment.

FIG. 4C is a top view of the EUV photolithography system 400, according to one embodiment. The top view of FIG. 4C illustrates that the light sensors 162 and the lenses 164 are positioned radially around the collector 102. Though not shown in FIG. 4C, the on the surface charged particle detectors 160 may also be radially arranged. FIG. 4C also illustrates the plasmatized droplet 140 of FIG. 4B. The 3D model described previously can indicate the shape of the droplet 140 in the horizontal plane as seen from the top view of FIG. 4C. FIG. 4C also shows the accumulated contamination 171 on the surface 128 of the collector 102.

Figure 5:
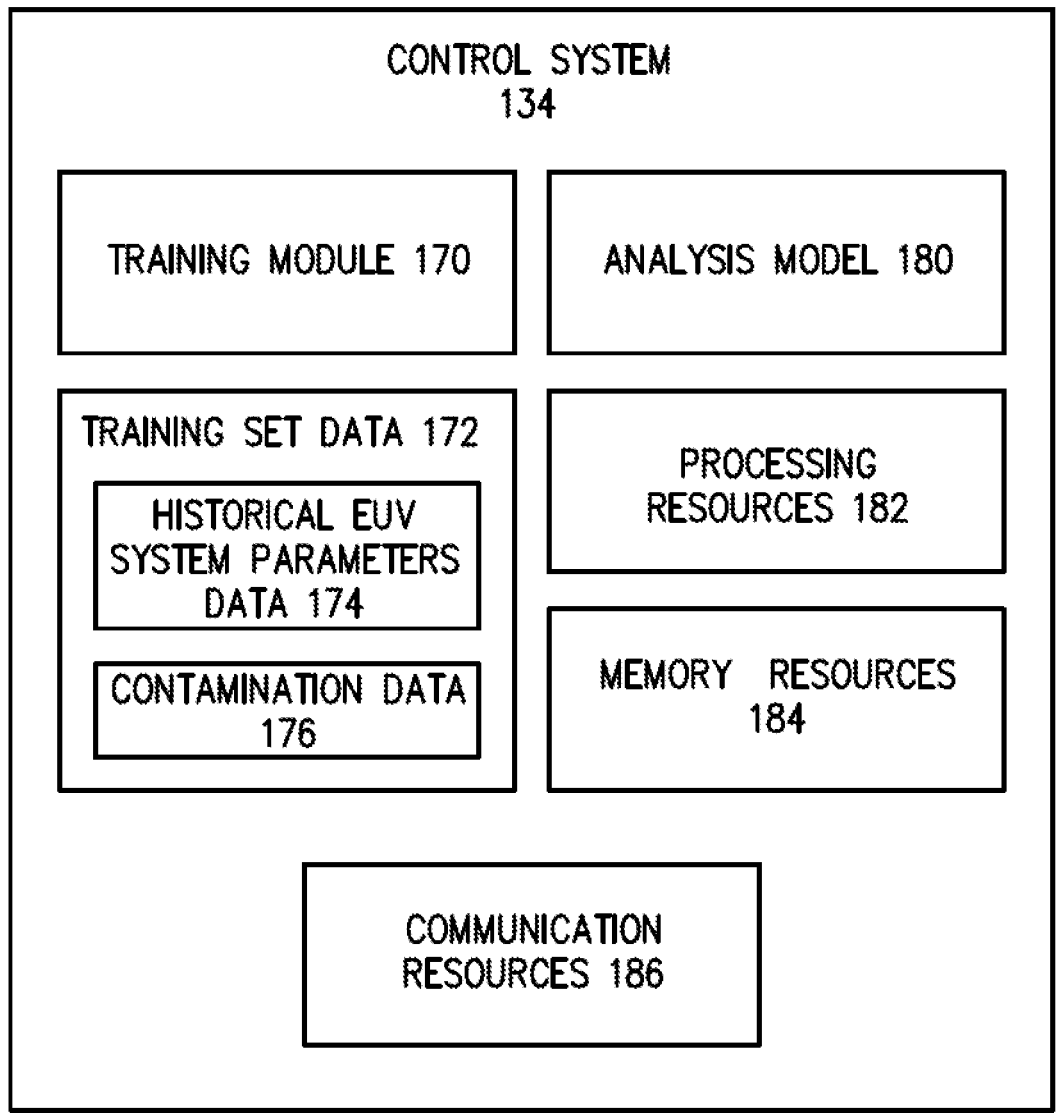
FIG. 5 is a block diagram of a control system of a photolithography system, according to one embodiment.

FIG. 5 is a block diagram of the control system 134, according to one embodiment. The control system 134 of FIG. 5 is configured to control operation of a EUV photolithography system, according to one embodiment. The control system 134 utilizes machine learning to predict droplet matter accumulation based on the plasma generation parameters and the buffer fluid flow parameters.

In one embodiment, the control system 134 includes an analysis model 180 and a training module 170. The training module trains the analysis model 180 with a machine learning process. The machine learning process trains the analysis model 180 to predict droplet matter accumulation based on EUV system parameters including buffer fluid flow parameters and EUV generation parameters. Although the training module 170 is shown as being separate from the analysis model 180, in practice, the training module 170 may be part of the analysis model 180.

The control system 134 includes, or stores, training set data 172. The training set data 172 includes historical EUV system parameters data 174 and contamination data 176. The historical EUV system parameters data 174 includes EUV generation parameters and buffer flow parameters for a large number of historical EUV generation processes. The contamination data 176 includes, for each historical EUV generation process, data indicating the accumulation of droplet matter at various regions of the surface 128 and the surface 130. As will be set forth in more detail below, the training module 170 utilizes the historical EUV system parameters data 174 and the contamination data 176 to train the analysis model 180 with a machine learning process.

In one embodiment, the historical EUV system parameters data 174 includes data related to plasma generation parameters and buffer fluid flow parameters. The plasma generation parameters can include droplet speed, droplet size, laser pulse energies, laser pulse timing, laser pulse location, 3D models of plasma generation, models of droplet shape after the first laser pulse and after the second laser pulse, and other parameters related to the generation of EUV radiation for photolithography processes. The buffer fluid flow parameters can include flow rates from individual mass flow controllers, the flow rates from the outlet 112 or individual outlets 112, or other parameters related to the flow of the buffer fluid 148.

In one embodiment, the contamination data 176 includes for each historical EUV system parameters in the historical EUV system parameters data 174, a respective label. Each label indicates the accumulation of droplet material at various regions of the surfaces 128 and 130.

In one embodiment the analysis model 180 includes a neural network. Training of the analysis model 180 will be described in relation to a neural network. However, other types of analysis models or algorithms can be used without departing from the scope of the present disclosure. The training module 170 utilizes the training set data 172 to train the neural network with a machine learning process. During the training process, the neural network receives, as input, historical EUV system parameters data 174 from the training set data 172. During the training process, the neural network outputs predicted contamination data. The predicted contamination data predicts, for each set of historical EUV system parameters provided to the analysis model 180, the contamination map corresponding to that set of data. The training process trains the neural network to generate predicted contamination data that matches the contamination data 176 for each set of historical EUV system parameters.

In one embodiment, the neural network includes a plurality of neural layers. The various neural layers include neurons that define one or more internal functions. The internal functions are based on weighting values associated with neurons of each neural layer of the neural network. During training, the control system 134 compares, for each set of historical EUV system parameters data, the predicted contamination data to the actual label from the contamination data 176. The control system generates an error function indicating how closely the predicted contamination data matches the contamination data 176. The control system 134 then adjusts the internal functions of the neural network. Because the neural network generates predicted contamination data based on the internal functions, adjusting the internal functions will result in the generation of different predicted contamination data for a same set of historical EUV system parameters data. Adjusting the internal functions can result in predicted contamination data that produces larger error functions (worse matching to the contamination data 176) or smaller error functions (better matching to the contamination data 176).

After adjusting the internal functions of the neural network, the historical EUV system parameters data 174 is again passed to the neural network and the analysis model 180 again generates predicted contamination data. The training module 170 again compares the predicted contamination data to the contamination data 176. The training module 170 again adjusts the internal functions of the neural network. This process is repeated in a very large number of iterations of monitoring the error functions and adjusting the internal functions of the neural network until a set of internal functions is found that results in predicted contamination data that matches the contamination data 176 across the entire training set.

At the beginning of the training process, the predicted contamination data likely will not match the contamination data 176 very closely. However, as the training process proceeds through many iterations of adjusting the internal functions of the neural network, the errors functions will trend smaller and smaller until a set of internal functions is found that results in predicted contamination data that match the contamination data 176. Matching can be based on a selected threshold. For example, the selected threshold error can be 5%. In this case, if the error is less than 5%, then the predicted contamination data is considered to match the contamination data 176. Identification of a set of internal functions that results in predicted contamination data that matches the contamination data 176 corresponds to completion of the training process. Once the training process is complete, the neural network is ready to be used to adjust EUV generation parameters and buffer fluid flow parameters. In one embodiment, after the analysis model 180 has been trained, the analysis model 180 can be utilized to analyze the EUV generation parameters and the buffer fluid flow parameters and predict droplet accumulation of various regions of the surfaces 128 and 130.

In one embodiment, the control system 134 includes processing resources 182, memory resources 184, and communication resources 186. The processing resources 182 can include one or more controllers or processors. The processing resources 182 are configured to execute software instructions, process data, make photolithography control decisions, perform signal processing, read data from memory, write data to memory, and to perform other processing operations. The processing resources 182 can include physical processing resources 182 located at a site or facility of the EUV photolithography system. The processing resources can include virtual processing resources 182 remote from the site EUV photolithography system or a facility at which the EUV photolithography system is located. The processing resources 182 can include cloud-based processing resources including processors and servers accessed via one or more cloud computing platforms.

In one embodiment, the memory resources 184 can include one or more computer readable memories. The memory resources 184 are configured to store software instructions associated with the function of the control system and its components, including, but not limited to, the analysis model 180. The memory resources 184 can store data associated with the function of the control system 134 and its components. The data can include the training set data 172, current process conditions data, and any other data associated with the operation of the control system 134 or any of its components. The memory resources 184 can include physical memory resources located at the site or facility of the EUV photolithography system 100. The memory resources can include virtual memory resources located remotely from site or facility of the EUV photolithography system 100. The memory resources 184 can include cloud-based memory resources accessed via one or more cloud computing platforms.

In one embodiment, the communication resources can include resources that enable the control system 134 to communicate with equipment associated with the EUV photolithography system 100. For example, the communication resources 186 can include wired and wireless communication resources that enable the control system 134 to receive the sensor data associated with the EUV photolithography system and to control equipment of the EUV photolithography system. The communication resources 186 can enable the control system 134 to control the various components of the EUV photolithography system. The communication resources 186 can enable the control system 134 to communicate with remote systems. The communication resources 186 can include, or can facilitate communication via, one or more networks such as wide networks, wireless networks, the Internet, or an intranet. The communication resources 186 can enable components of the control system 134 to communicate with each other.

In one embodiment, the analysis model 180 is implemented via the processing resources 182, the memory resources 184, and the communication resources 186. The control system 134 can be a dispersed control system with components and resources and locations remote from each other and from the EUV photolithography system.

The components, functionality, and processes described in relation to the control system 134 and the analysis model 180 can be extended to the control systems and analysis models described in relation to FIGS. 1-4.

Figure 6:
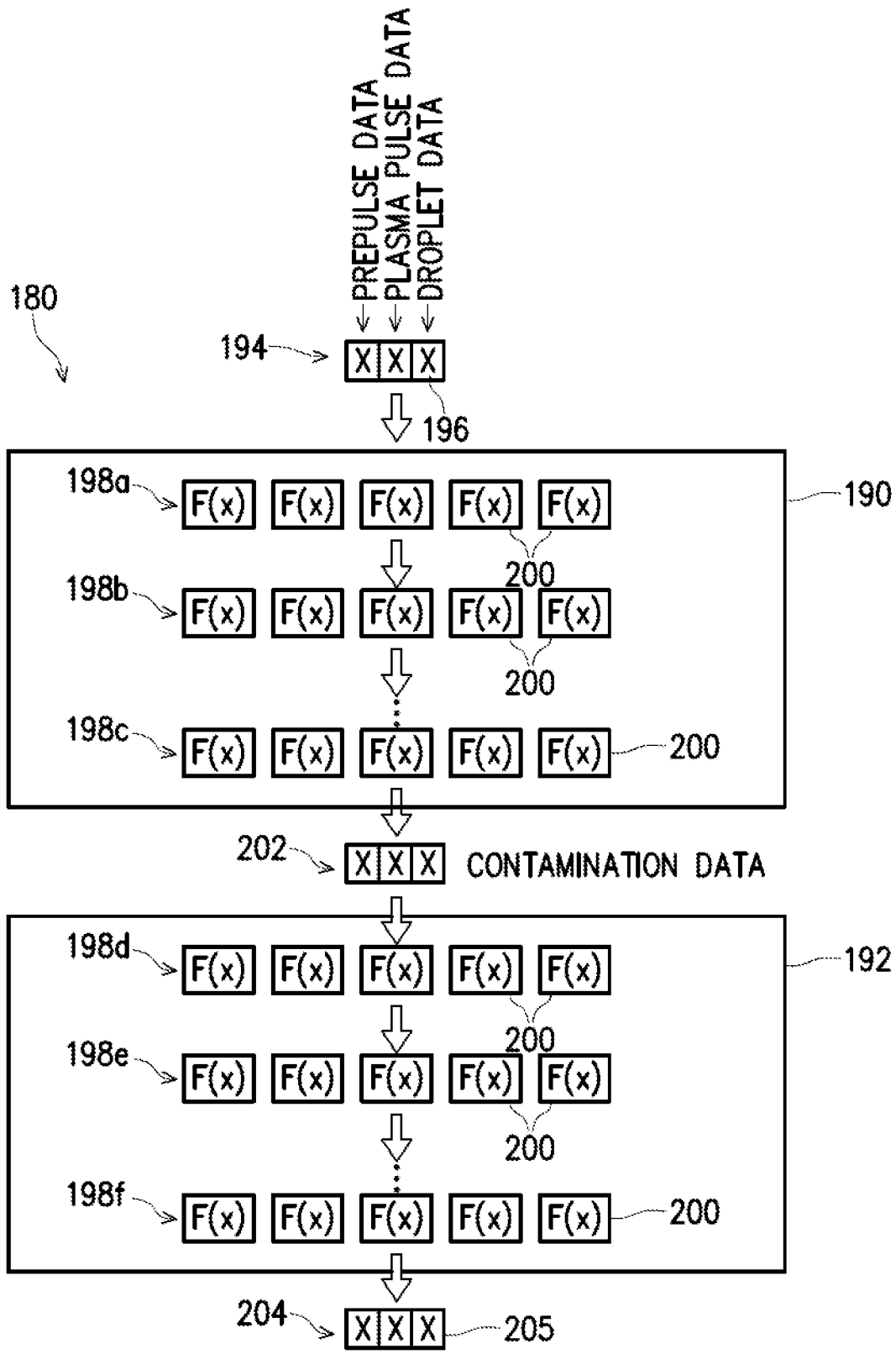
FIG. 6 is a block diagram of an analysis model of a control system, according to one embodiment.

FIG. 6 is a block diagram of an analysis model 180, according to one embodiment. The analysis model 180 can be part of the control system 134 of FIGS. 1A and 5 and can operate in conjunction with the systems and processes described in relation to FIGS. 1-6, according to one embodiment. The analysis model 180 includes an encoder neural network 190 and a decoder neural network 192. The analysis model 180 is trained with a machine learning process to identify recommended changes to plasma generation parameters based on sensed plasma and contamination qualities, such as those sensed by the light sensors 162 and the charged particle detectors 160. The analysis model 180 of FIG. 6 is only one example of an analysis model. Many other kinds of analysis models and training processes can be utilized without departing from the present disclosure.

The training process utilizes a training set. The training set includes historical plasma generation conditions data. Each set of historical plasma generation conditions data includes, for a particular EUV generation process, the parameters of the flattening laser pulse, the parameters of the plasmatizing laser pulse, and the parameters of the droplets. The training set includes, for each set of historical plasma generation conditions, historical contamination data that resulted from the historical plasma generation conditions.

Each previously performed EUV generation process took place with particular plasma generation conditions and resulted in particular contamination patterns. The plasma generation conditions for each plasma data value are formatted into a respective plasma generation conditions vector 194. The plasma generation conditions vector 194 includes a plurality of data fields 166. Each data field 196 corresponds to a particular process condition.

The example of FIG. 6 illustrates a single plasma generation conditions vector 194 that will be passed to the encoder 190 of the analysis model 180 during the training process. In the example of FIG. 6, the plasma generation conditions vector 194 includes three data fields 166. A first data field 196 corresponds to the prepulse laser settings. In practice, there may be multiple data fields 166 for the prepulse laser settings, one for each of pulse power, pulse duration, pulse timing, etc. A second data field 196 corresponds to plasmatizing laser pulse settings. In practice, there may be multiple data fields 166 for each of a plurality of settings include pulse power, pulse duration, pulse timing, and other factors. A third data field 196 corresponds to the droplet settings. In practice, there may be multiple data fields 166 for each of a plurality of droplet settings including droplet speed, droplet size, droplet temperatures, etc. Each plasma generation conditions vector 194 can include different types of plasma generation conditions without departing from the scope of the present disclosure. The particular plasma generation conditions illustrated in FIG. 6 are given only by way of example. Each process condition is represented by a numerical value in the corresponding data field 196.

The encoder 190 includes a plurality of neural layers 198a-c. Each neural layer includes a plurality of nodes 200. Each node 200 can also be called a neuron. Each node 200 from the first neural layer 198a receives the data values for each data field from the plasma generation conditions vector 194. Accordingly, in the example of FIG. 6, each node 200 from the first neural layer 198a receives three data values because the plasma generation conditions vector 194 has three data fields, though as mentioned above, in practice, the plasma generation conditions vector 194 may include many more data fields than 3. Each neuron 200 includes a respective internal mathematical function labeled F(x) in FIG. 6. Each node 200 of the first neural layer 198a generates a scalar value by applying the internal mathematical function F(x) to the data values from the data fields 166 of the plasma generation conditions vector 194. Further details regarding the internal mathematical functions F(x) are provided below.

In the example of FIG. 6, each neural layer 198a-168e in both the encoder 190 and the decoder 192 are fully connected layers. This means that each neural layer has the same number of nodes as the succeeding neural layer. In the example of FIG. 6, each neural layer 198a-168e includes five nodes. However, the neural layers of the encoder 190 and the decoder 192 can include different numbers of layers than are shown in FIG. 6 without departing from the scope of the present disclosure.

Each node 200 of the second neural layer 198b receives the scalar values generated by each node 200 of the first neural layer 198a. Accordingly, in the example of FIG. 6 each node of the second neural layer 198b receives five scalar values because there are five nodes 200 in the first neural layer 198a. Each node 200 of the second neural layer 198b generates a scalar value by applying the respective internal mathematical function F(x) to the scalar values from the first neural layer 198a.

There may be one or more additional neural layers between the neural layer 198b and the neural layer 198c. The final neural layer 198c of the encoder 190 receives the five scalar values from the five nodes of the previous neural layer (not shown). The output of the final neural layer is the predicted contamination data 202. In practice, the predicted contamination data may be a vector including many data fields. Each data field corresponds to a particular aspect of a sensed contamination map of the collector. The contamination map can indicate the contamination level at each of a plurality of surface zones of the collector. The contamination data vector includes data fields that indicate the contamination level at the various surface zones.

During the machine learning process, the analysis model compares the predicted contamination data 202 to the actual contamination data. The analysis model 180 generates an error value indicating the error or difference between the predicted contamination data 202 The error value is utilized to train the encoder 190.

The training of the encoder 190 can be more fully understood by discussing the internal mathematical functions F(x). While all of the nodes 200 are labeled with an internal mathematical function F(x), the mathematical function F(x) of each node is unique. In one example, each internal mathematical function has the following form:

$$F(x)=x_1*w_1+x_2*w_2+\ldots x_n*w_1+b.$$

In the equation above, each value $x_1$-$x_n$ corresponds to a data value received from a node 200 in the previous neural layer, or, in the case of the first neural layer 198a, each value $x_1$-$x_n$ corresponds to a respective data value from the data fields 166 of the plasma generation conditions vector 194. Accordingly, n for a given node is equal to the number of nodes in the previous neural layer. The values $w_1$-$w_n$ are scalar weighting values associated with a corresponding node from the previous layer. The analysis model 180 selects the values of the weighting values $w_1$-$w_n$. The constant b is a scalar biasing value and may also be multiplied by a weighting value. The value generated by a node 200 is based on the weighting values $w_1$-$w_n$. Accordingly, each node 200 has n weighting values $w_1$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions. Each function F(x) may also include a transfer function.

After the error value has been calculated, the analysis model 180 adjusts the weighting values $w_1$-$w_n$ for the various nodes 200 of the various neural layers 198a-168c. After the analysis model 180 adjusts the weighting values $w_1$-$w_n$, the analysis model 180 again provides the plasma generation conditions vector 194 to the input neural layer 198a. Because the weighting values are different for the various nodes 200 of the analysis model 180, the predicted contamination data 202 will be different than in the previous iteration. The analysis model 180 again generates an error value by comparing the actual contamination data to the predicted contamination data 202.

The analysis model 180 again adjusts the weighting values $w_1$-$w_n$ associated with the various nodes 200. The analysis model 180 again processes the plasma generation conditions vector 194 and generates a predicted contamination data 202 and associated error value. The training process includes adjusting the weighting values $w_1$-$w_n$ in iterations until the error value is minimized.

FIG. 6 illustrates a single plasma generation conditions vector 194 being passed to the encoder 190. In practice, the training process includes passing a large number of plasma generation conditions vectors 194 through the analysis model 180, generating a predicted contamination data 202 for each plasma generation conditions vector 194, and generating an associated error value for each predicted contamination data. The training process can also include generating an aggregated error value indicating the average error for all the predicted contamination data for a batch of plasma generation conditions vectors 194. The analysis model 180 adjusts the weighting values $w_1$-$w_n$ after processing each batch of plasma generation conditions vectors 194. The training process continues until the average error across all plasma generation conditions vectors 194 is less than a selected threshold tolerance. When the average error is less than the selected threshold tolerance, the training of the encoder 190 is complete and the analysis model is trained to accurately predict the contamination data based on the plasma generation conditions.

The decoder 192 operates and is trained in a similar manner as the encoder 190 as described above. During the training process of the decoder 192, the decoder receives contamination data associated with a plasma generation conditions vector 194. The contamination data is received by each node 200 of the first neural layer 198d of the decoder 192. The nodes 200 and the first neural layer 198d apply their respective functions F(x) to the contamination data values and pass the resulting scalar values to the nodes 200 of the next neural layer 198e. After the final neural layer 198f processes the scalar values received from the previous neural layer (not shown), the final neural layer 198f outputs a predicted plasma generation conditions vector 204. The predicted plasma generation conditions vector 204 has the same form as the plasma generation conditions vector 194. The data fields 205 of the predicted plasma generation conditions vector 204 represent the same parameters or conditions as the data fields 196 of the plasma generation conditions vector 194.

The training process compares the predicted plasma generation conditions vector 204 to the plasma generation conditions vector 194 and determines an error value. The weighting parameters of the functions F(x) of the nodes 200 of the decoder 192 are adjusted and the contamination data is again provided to the decoder 192. The decoder 192 again generates a predicted plasma generation conditions vector 204 and an error value is determined. This process is repeated for all of the plasma generation conditions vectors in the historical plasma generation conditions data and for all of the historical contamination data from the historical plasma data until the decoder 192 can generate, for each historical plasma data value, a predicted plasma generation conditions vector 172 that matches the corresponding plasma generation conditions vector 194. The training process is complete when a prediction cumulative error value is lower than the threshold error value.

After the encoder 190 and the decoder 192 have been trained as described above, the analysis model 180 is ready to generate recommended plasma generation parameters to reduce contamination, and hence, the resulting EUV quality produced by the EUV photolithography systems described in relation to FIGS. 1-5. During operation, the analysis model receives a current plasma generation conditions vector representing current conditions or parameters of the EUV photolithography systems described in relation to FIGS. 1-5. The encoder 190 processes the current plasma generation conditions vector and generates predicted future contamination data based on the current plasma generation conditions vector. If the predicted future contamination data is less than desired, then the decoder 192 is utilized to generate a set of recommended plasma generation conditions that will result in reduced contamination. In particular, the decoder 192 receives contamination data reflecting reduced contamination. The decoder 192 then generates a predicted plasma generation conditions vector based on the reduced contamination values.

The predicted plasma generation conditions vector includes recommended plasma generation conditions values for certain of the plasma generation conditions types. For example, the predicted plasma generation conditions vector can include a recommended values for the various prepulse laser conditions, the plasmatizing laser pulse conditions, and the droplet conditions. These conditions can include laser prepulse and plasma pulse energy, laser position, laser stability, beam size, pulse duration, laser wavelength, laser pulse timing, droplet position, droplet stability, droplet timing, plasma ion density, plasma electron density, plasma temperature, plasma pancake angle, and plasma position.

Many other kinds of analysis models, training processes, and data forms can be utilized without departing from the scope of the present disclosure.

In another example, the contamination data 202 includes plasma quality data. In other words, the output of the encoder includes contamination data and plasma quality data. In this case, the training process includes not only historical contamination data, but also historical plasma quality data. The historical plasma quality data corresponds to characteristics of the plasmatized droplets that resulted from particular historical plasma generation conditions. The historical plasma quality can determined based on the output of the light sensors 162 and the charged particle detectors 160 as described previously. The training process trains the encoder 190 to predict both contamination data and plasma quality data based on the plasma generation conditions vectors 194. The decoder 192, in turn, is trained to predict plasma generation conditions that result in the plasma quality data and the contamination data. This results in the decoder 192 being able to generate recommended plasma generation conditions that will result in both improved contamination data and improved/maintained plasma quality.

Figure 7:
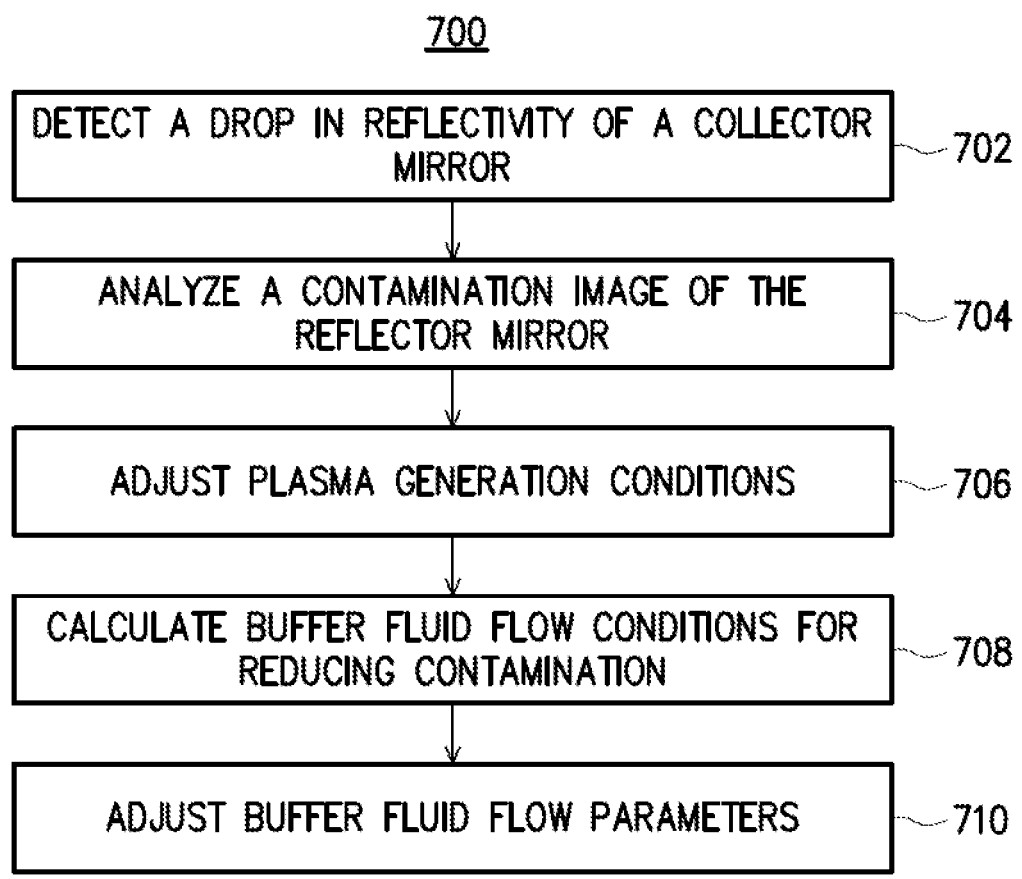
FIG. 7 is a flow diagram of a method for operating a photolithography system, according to one embodiment.

In another example, the plasma generation conditions vectors 194 can include buffer fluid flow parameters. The buffer fluid flow parameters can indicate the flow rate of buffer fluid through various channels, as well as the position of director vanes. In this case, the analysis model 180 can be trained to suggest buffer fluid flow parameters that will result in reduced contamination using the same training principles described above but including buffer fluid flow data in the plasma conditions vectors 194. FIG. 7 is a flow diagram of a method 700 for operating a photolithography system, according to one embodiment. The method 700 can utilize the systems, components, and processes described in relation to FIGS. 1-6. At 702, the method 700 includes detecting a drop in reflectivity of a collector mirror. One example of a collector mirror is the collector mirror 102 of FIG. 1A. At 704, the method 700 includes analyzing a contamination image of the reflector mirror. At 706, the method 700 includes adjusting plasma generation conditions. At 708, the method 700 includes calculating buffer fluid flow conditions for reducing contamination. At 710, the method 700 incudes adjusting buffer fluid flow parameters.

Figure 8:
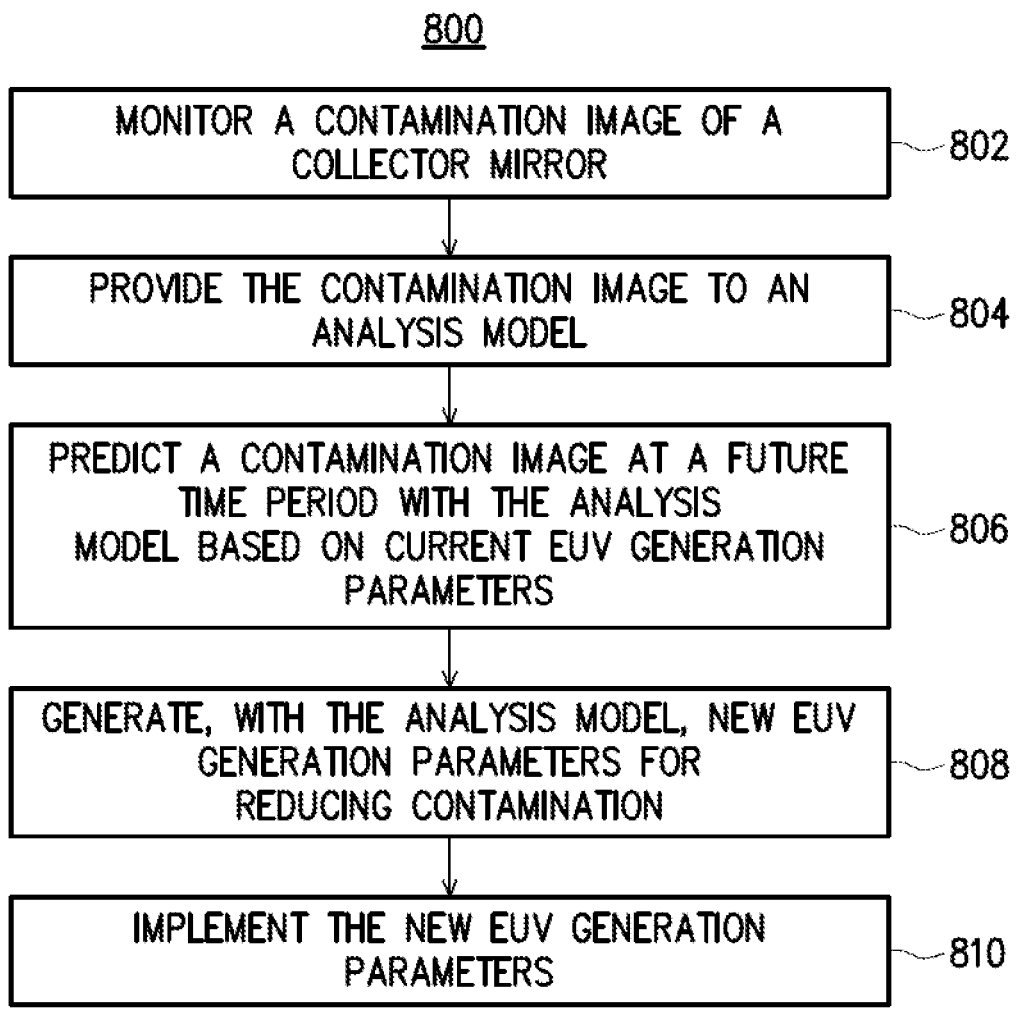
FIG. 8 is a flow diagram of a method for operating a photolithography system, according to one embodiment.

FIG. 8 is a method 800 for operating a photolithography system, according to one embodiment. The method 800 can utilize the systems, components, and processes described in relation to FIGS. 1-7. At 802, the method 800 includes monitoring a contamination image of a collector mirror. One example of a collector mirror is the collector mirror 102 of FIG. 1A. At 804, the method 800 includes providing the contamination image to an analysis model. One example of an analysis model is the analysis model 180 of FIG. 5. At 806, the method 800 includes predicting a contamination image at a future time period with the analysis model based on current EUV generation parameters. At 808, the method 800 includes generating, with the analysis model, new EUV generation parameters for reducing contamination. At 810, the method 800 includes implementing the new EUV generation parameters.

Figure 9:
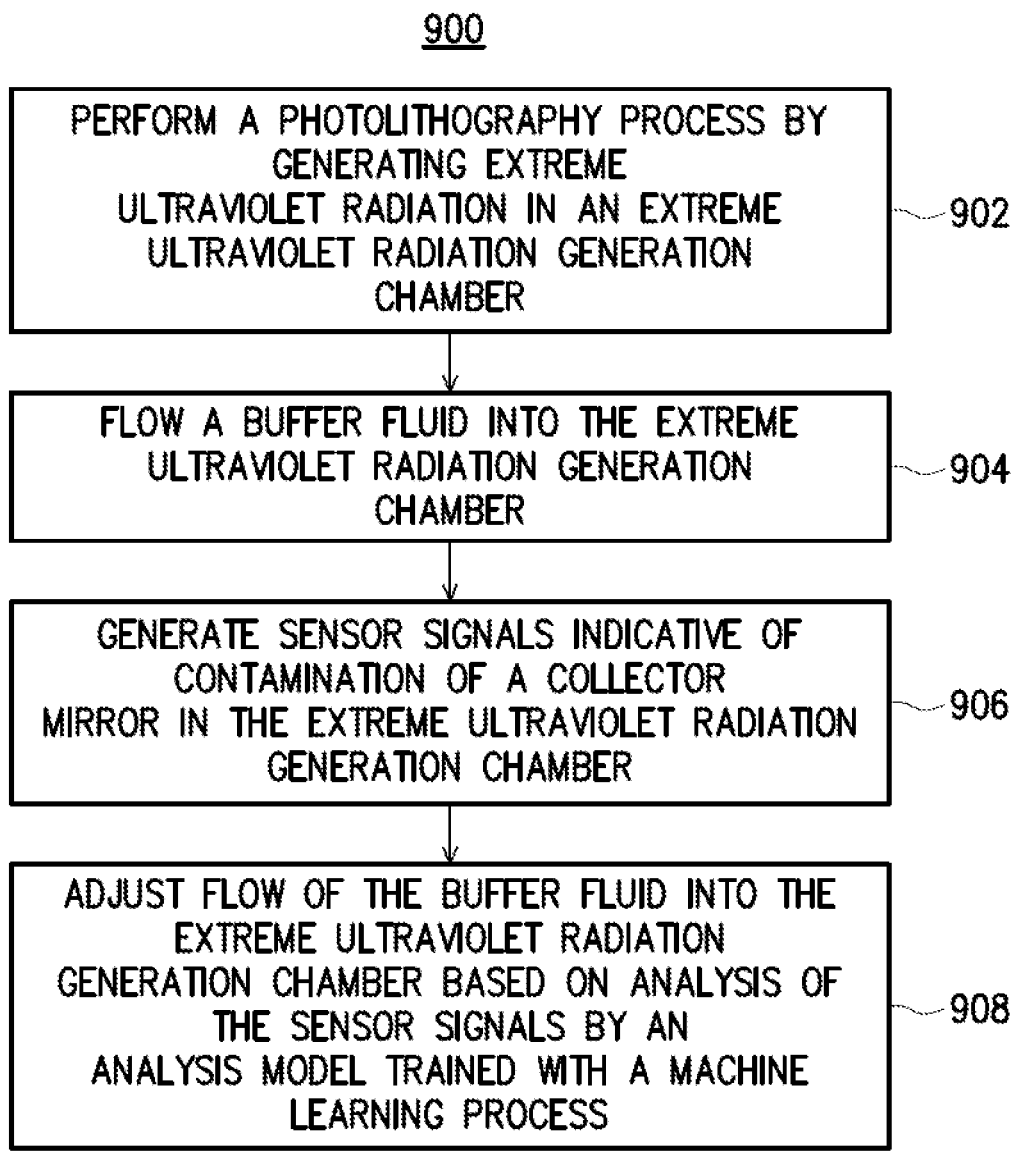
FIG. 9 is a flow diagram of a method for operating a photolithography system, according to one embodiment.

FIG. 9 is a method 900 for reducing contamination in an EUV photolithography system, according to an embodiment. The method 900 can utilize the systems, components, and processes described in relation to FIGS. 1-8. At 902, the method 900 includes performing a photolithography process by generating extreme ultraviolet radiation in an extreme ultraviolet radiation generation chamber. One example of an extreme ultraviolet radiation generation chamber is the extreme ultraviolet generation chamber 101 of FIG. 1A. At 904, the method 900 includes flowing a buffer fluid into the extreme ultraviolet radiation generation chamber. At 906, the method 900 includes generating sensor signals indicative of contamination of the collector mirror in the extreme ultraviolet radiation generation chamber. One example of a collector mirror is the collector mirror 102 of FIG. 1A. At 908, the method 900 includes adjusting a flow of the buffer fluid into the extreme ultraviolet radiation generation chamber based on analysis of the sensor signals by the analysis model trained with a machine learning process. One example of an analysis model is the analysis model 180 of FIG. 5.

Figure 10:
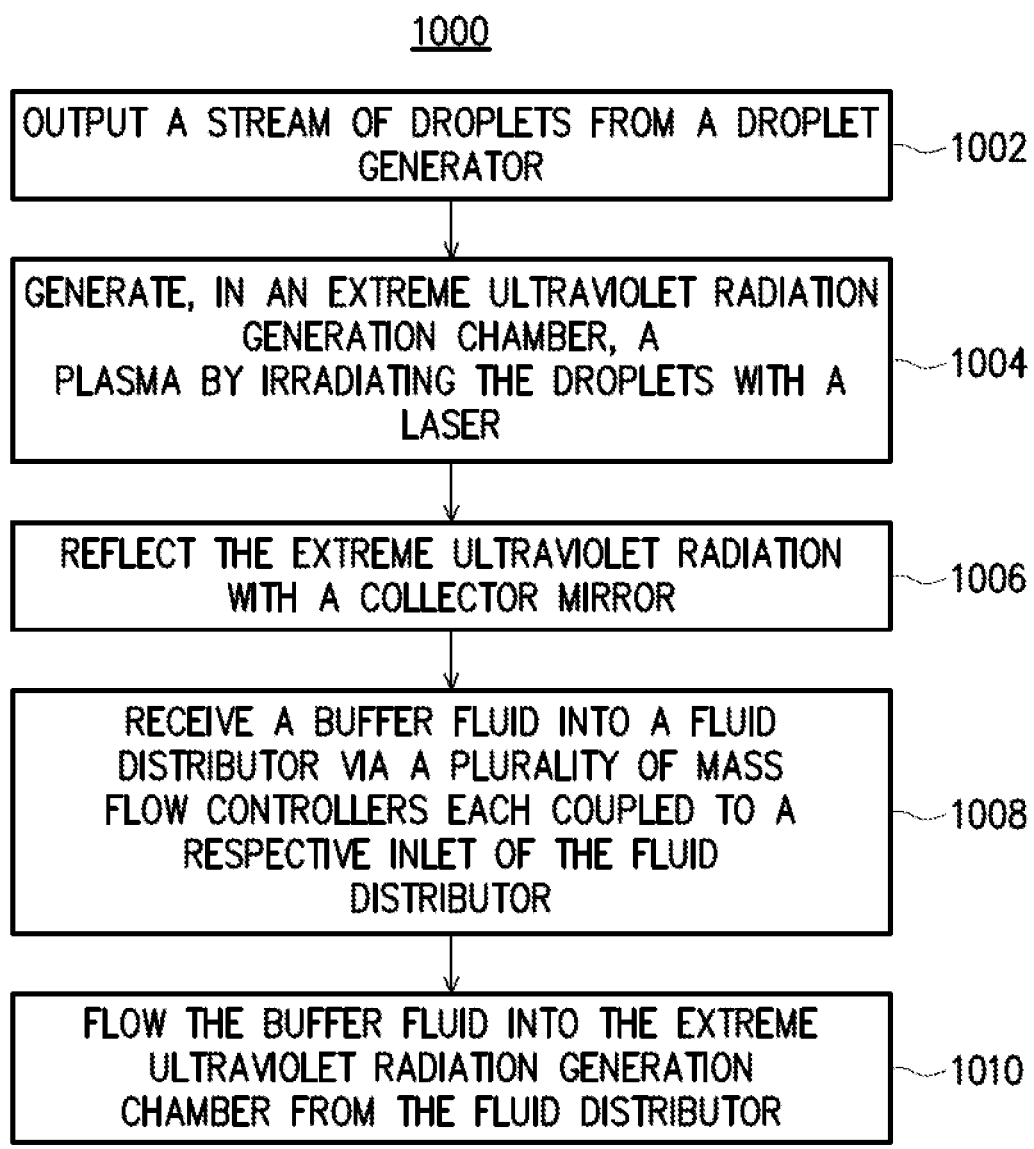
FIG. 10 is a flow diagram of a method for operating a photolithography system, according to one embodiment.

FIG. 10 is a method 1000 for reducing contamination in an EUV photolithography system, according to one embodiment. The method 1000 can utilize the systems, components, and processes described in relation to FIGS. 1-9. At 1002, the method 1000 includes outputting a stream of droplets from a droplet generator. One example of droplets are the droplets 140 of FIG. 1B. One example of a droplet generator is the droplet generator 114 of FIG. 1B. At 1004, the method 1000 includes generating, in an extreme ultraviolet radiation generation chamber, a plasma by irradiating the droplets with a laser. One example of an extreme ultraviolet radiation generation chamber is the extreme ultraviolet radiation generation chamber 101 of FIG. 1B. One example of a laser is the laser 106 of FIG. 1B. At 1006, the method 1000 includes reflecting the extreme ultraviolet radiation with a collector mirror. One example of the collector mirror is the collector mirror 102 of FIG. 1B. At 1008, the method 1000 includes receiving a buffer fluid into a fluid distributor via a plurality of mass flow controllers each coupled to a respective inlet of the fluid distributor. One example of a fluid distributor is the fluid distributor 108 of FIG. 1B. One example of mass flow controllers are the mass flow controllers 1020 of FIG. 1B. One example of an inlet is the inlets 110 of FIG. 1B. At 1010, the method 1000 includes flowing the buffer fluid into the extreme ultraviolet radiation generation chamber from the fluid distributor.

In one embodiment, a photolithography system includes a shield including an interior surface and a collector mirror coupled to the shield and including a reflective surface. The collector mirror and the shield define an extreme ultraviolet radiation generation chamber. The system includes a fluid source configured to hold a buffer fluid, a plurality of mass flow controllers each configured to receive the buffer fluid from the fluid source, and a fluid distributor. The fluid distributor includes a plurality of fluid inlets each coupled to a respective one of the mass flow controllers and configured to receive the buffer fluid from the mass flow controller and one or more outlets configured to supply the buffer fluid into the extreme ultraviolet radiation generation chamber.

In one embodiment, a method includes performing a photolithography process by generating extreme ultraviolet radiation in an extreme ultraviolet radiation generation chamber and flowing a buffer fluid into the extreme ultraviolet radiation generation chamber. The method includes generating sensor signals indicative of contamination of a collector mirror in the extreme ultraviolet radiation generation chamber. The method includes adjusting flow of the buffer fluid into the extreme ultraviolet radiation generation chamber based on analysis of the sensor signals by an analysis model trained with a machine learning process.

In one embodiment, a method includes outputting a stream of droplets from a droplet generator and generating, in an extreme ultraviolet radiation generation chamber, a plasma by irradiating the droplets with a laser. The method includes reflecting the extreme ultraviolet radiation with a collector mirror, receiving a buffer fluid into a fluid distributor via a plurality of mass flow controllers each coupled to a respective inlet of the fluid distributor, and flowing the buffer fluid into the extreme ultraviolet radiation generation chamber from the fluid distributor.

Embodiments of the present disclosure provide many benefits to extreme ultraviolet radiation photolithography systems. Embodiments of the present disclosure reduce contamination of components of the extreme ultraviolet photolithography systems. Embodiments of the present disclosure dynamically adjust the flow of a buffer fluid into an extreme ultraviolet radiation generation chamber. The buffer fluid helps to prevent and remove contamination of sensitive components of the extreme ultraviolet radiation generation chamber. This helps to ensure that photolithography processes have adequate extreme ultraviolet radiation. Furthermore, because contamination is removed and prevented, sensitive components of the extreme ultraviolet radiation systems do not have to be replaced as frequently. The sensitive components can be extremely expensive. Accordingly embodiments of the present disclosure not only enhance the effectiveness of photolithography processes, but they also reduce the cost of operating the photolithography system because components need to be replaced less frequently.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
one or more computer memories configured to store software instructions;
one or more processors configured to perform a method by executing the software instructions, wherein the method includes:
performing a photolithography process by generating extreme ultraviolet radiation in an extreme ultraviolet radiation generation chamber;
flowing a buffer fluid into a pair of fluid chambers of a fluid distributor separated from each other by a partition and each having a respective outlet into the extreme ultraviolet radiation generation chamber;
generating a contamination map of a collector mirror based on sensor signals; and
selecting buffer fluid flow parameters with an analysis model to reduce contamination of the collector mirror based on the contamination map.

2. The system of claim 1, comprising adjusting flow of the buffer fluid by selectively adjusting a flow rate of the buffer fluid from multiple mass flow controllers.

3. The system of claim 2, wherein adjusting flow of the buffer fluid includes adjusting a director vane positioned at an outlet of a fluid dispenser that outputs the buffer fluid into the extreme ultraviolet radiation generation chamber.

4. The system of claim 1, wherein the buffer fluid is configured to remove accumulation of debris from the collector mirror.

5. The system of claim 1, wherein the contamination results from irradiating droplets with laser light within the extreme ultraviolet radiation generation chamber, wherein the buffer fluid is selected to etch material from the droplets.

6. The system of claim 5, wherein the droplets include tin, wherein the buffer fluid includes hydrogen gas.

7. The system of claim 1, wherein the method includes patterning a layer of photoresist on a wafer with the extreme ultraviolet radiation.

8. The system of claim 1, further comprising a shield coupled to the collector mirror and including an interior surface, wherein the collector mirror and the shield define an extreme ultraviolet radiation generation chamber.

9. The system of claim 1, wherein the analysis model includes a neural network.

10. A system, comprising:
an extreme ultraviolet radiation generation chamber including an interior surface;
a fluid distributor including a first fluid chamber and second fluid chamber separated from each other by a partition and each having a respective outlet into the extreme ultraviolet radiation generation chamber; and
a director vane coupled to the partition and configured to selectively adjust the flow of the buffer fluid into the extreme ultraviolet radiation chamber from the outlets.

11. The photolithography system of claim 10, wherein:
the first fluid chamber is configured to receive the buffer fluid from a first group of inlets; and
the second fluid chamber is configured to receive the buffer fluid from a second group of inlets.

12. The photolithography system of claim 11, wherein the first fluid chamber is coaxial with the second fluid chamber.

13. The photolithography system of claim 10, comprising mass flow controllers each positioned in a respective inlet.

14. The photolithography system of claim 10, further comprising:
one or more sensors configured to output sensor signals indicative of contamination of a reflective surface of the collector mirror; and
a control system configured to receive the sensor signals and to adjust flow of the buffer fluid into the extreme ultraviolet radiation generation chamber responsive to the sensor signals.

15. The photolithography system of claim 14, wherein the control system includes an analysis model trained with a machine learning process to select buffer fluid flow parameters responsive to contamination of the reflective surface of the collector mirror.

16. The photolithography system of claim 15, wherein the analysis model includes a neural network.

17. A method, comprising:
generating, in an extreme ultraviolet radiation generation chamber, extreme ultraviolet radiation;
reflecting the extreme ultraviolet radiation with a collector mirror;
passing a buffer fluid from a pair of fluid chambers separated from each other by a partition;
flowing the buffer fluid from each fluid chamber into the extreme ultraviolet generation chamber via respective fluid outlets adjacent to each other;
operating an adjustable director vane coupled to the partition adjacent to the outlets and configured to selectively adjust a flow of the buffer fluid from each of the outlets.

18. The method of claim 17, comprising:
sensing contamination of the interior surface with one or more sensors;
selecting, with an analysis model, new extreme ultraviolet radiation generation parameters and new buffer fluid flow parameters based on the sensed contamination of the collector mirror; and
reducing the contamination of the collector mirror by implementing the new extreme ultraviolet radiation generation parameters and the new buffer fluid flow parameters.

19. The method of claim 18, further comprising training the analysis model with a machine learning process to select new extreme ultraviolet radiation generation parameters and new buffer fluid flow parameters based on the contamination of the collector mirror.

20. The method of claim 17, wherein the buffer fluid includes hydrogen gas.

\* \* \* \* \*